(12) United States Patent
Chen et al.

(10) Patent No.: US 8,217,815 B2
(45) Date of Patent: Jul. 10, 2012

(54) SIGMA-DELTA MODULATOR WITH SHARED OPERATIONAL AMPLIFIER AND ASSOCIATED METHOD

(75) Inventors: Jianqiu Chen, Shanghai (CN); Sterling Smith, Shanghai (CN); Jianping Cheng, Shanghai (CN)

(73) Assignee: MStar Semiconductor, Inc., Hsinchu Hsien (TW)

( * ) Notice: Subject to any disclaimer, the term of this patent is extended or adjusted under 35 U.S.C. 154(b) by 53 days.

(21) Appl. No.: 12/861,970

(22) Filed: Aug. 24, 2010

(65) Prior Publication Data

US 2011/0063155 A1 Mar. 17, 2011

Related U.S. Application Data

(60) Provisional application No. 61/242,349, filed on Sep. 14, 2009.

(51) Int. Cl.
*H03M 3/00* (2006.01)
(52) U.S. Cl. ........ 341/143; 341/118; 341/120; 341/155; 341/161; 341/172
(58) Field of Classification Search .................. 341/118, 341/120, 143, 155, 172
See application file for complete search history.

(56) References Cited

U.S. PATENT DOCUMENTS

| | | | | |
|---|---|---|---|---|
| 5,030,954 A * | 7/1991 | Ribner | ........................ | 341/172 |
| 5,392,043 A * | 2/1995 | Ribner | ........................ | 341/143 |
| 5,654,711 A * | 8/1997 | Fujimori | ..................... | 341/143 |
| 5,764,176 A * | 6/1998 | Ginetti | ......................... | 341/161 |
| 5,917,440 A * | 6/1999 | Khoury | ........................ | 341/143 |
| 6,140,950 A * | 10/2000 | Oprescu | ...................... | 341/143 |
| 6,538,588 B1 * | 3/2003 | Bazarjani | .................... | 341/143 |
| 6,608,575 B2 * | 8/2003 | Bazarjani | .................... | 341/143 |
| 7,280,066 B2 * | 10/2007 | Pernici et al. | ................ | 341/172 |
| 7,450,045 B2 * | 11/2008 | Liu | .............................. | 341/143 |
| 7,636,056 B2 * | 12/2009 | Inukai et al. | ................. | 341/143 |
| 2006/0187100 A1 * | 8/2006 | Kurose et al. | ................ | 341/143 |
| 2011/0006935 A1 * | 1/2011 | Kawahito | .................... | 341/126 |

* cited by examiner

*Primary Examiner* — Linh Nguyen
(74) *Attorney, Agent, or Firm* — Edell, Shapiro & Finnan, LLC

(57) ABSTRACT

A Sigma-Delta modulator with a shared operational amplifier (op-amp) includes an integrated circuit, having two integrators sharing the op-amp, capable of integrating two input signals of the two integrators; a plurality of quantizers, coupled to the integrating circuit, for comparing outputting signals of the integrators with a predetermined signal and then generating digital outputting signals; a plurality of DACs, respectively coupled to the quantizers, for converting the digital outputting signals to analog feedback signals to the integrators; and a clock generator, for providing clock signals to the integrating circuit and the quantizers. Accordingly, layout area and power consumption of the modulator are reduced due to the shared op-amp.

18 Claims, 14 Drawing Sheets

SIGMA-DELTA MODULATOR WITH SHARED OPERATIONAL AMPLIFIER AND ASSOCIATED METHOD

CROSS REFERENCE TO RELATED PATENT APPLICATION

This patent application claims the benefit of U.S. provisional patent application No. 61/242,349 filed on Sep. 14, 2009, the entirety of which is incorporated herein by reference.

FIELD OF THE INVENTION

The present invention relates to a Sigma-Delta (Σ-Δ) modulator and an associated method, and more particularly, to a multi-path Σ-Δ modulator with a shared operational amplifier (op-amp) and an associated method.

BACKGROUND OF THE INVENTION

As science and technology develop day by day, more and more common functions (e.g., audio processing, video processing, USB/DDR processing, and power management) are integrated on one chip, referred to as a system-on-chip, i.e., an SOC. A Σ-Δ modulator widely applied to audio analog-to-digital (DA) converting and radio frequency (RF) receiving fields may also be integrated with the SOC system.

The Σ-Δ modulator for converting an analog signal into a digital signal via over-sampling comprises an integrator, a quantizer, and a digital-to-analog converter (DAC). FIG. 1 shows a schematic diagram of a conventional single-path one-stage Σ-Δ modulator. An adder subtracts a feedback signal Vfb outputted by a DAC 300 from an input signal Vin to obtain a signal represented by (a1*Vin−b1*Vfb), where a1 and b1 are gain factors. The obtained signal is received and integrated by an integrator 100 to obtain an integrated signal that is transmitted to a quantizer 200. The quantizer 200 quantizes the integrated signal to obtain a digital signal Yout, which is converted by the DAC 300 into an analog signal that is then fed to the adder.

FIG. 2 shows a schematic circuit diagram of a single-path one-stage Σ-Δ modulator in the prior art. On top of the quantizer 200 and the DAC 300, the one-stage Σ-Δ modulator further comprises an op-amp 500, a sampling component Cs, an integrating component CI, and switches S1 to S4. Supposing that the op-amp 500 is in an ideal operating state, and the switches S1 to S4 are respectively controlled by two non-overlapped clocks P1 and P2. During a first period of a clock cycle, the clock signal P1 is at a high level, and the clock signal P2 is at a low level. At this point, the switches S1 and S3 are closed, and the switches S2 and S4 are open. During a second period of the clock cycle, the clock signal P1 is at a low level, and the clock signal P2 is at a high level. At this point, the switches S1 and S3 are open, and the switches S2 and S4 are closed. Detailed descriptions are given with reference to FIG. 3 and FIG. 4. Referring to FIG. 3, during the first period of the clock cycle, the sampling component Cs samples the input signal Vin via the switches S1 and S3, such that a voltage between two ends of the sampling component Cs is Vi[n−1]. At this point, the op-amp 500 is inactive, and a voltage at an output end of the op-amp 500 is maintained as Vo[n−1]. Referring to FIG. 4, during the second period of the clock cycle, a sampling component Cs, the op-amp 500 and the integrating component CI are coupled in sequence. Being affected by a feedback effect of the op-amp 500, charges of the sampling component Cs charged during the first period of the clock cycle are shifted to the integrating component CI, and a voltage at an output end of the op-amp 500 is calculated as:

$$Vo[n] = Vo[n-1] + \frac{Ccs}{Cci}Vi[n-1],$$

where Ccs is a capacitance value of the component Cs, and Cci is a capacitance value of the component CI. In addition, a Z-transform of the foregoing equation is:

$$Vo(z) = \frac{Ccs}{Cci} * \frac{z^{-1}}{1-z^{-1}}.$$

Accordingly, the circuit structure in FIG. 2 can realize a principle illustrated in FIG. 1.

The Σ-Δ modulator is widely applied as a contribution of having a simple structure and a high conversion accuracy, and various types of multi-stage modulators are accordingly developed. FIG. 5 and FIG. 6 show schematic diagrams of a conventional single-path two-stage Σ-Δ modulator. The single-path two-stage Σ-Δ modulator comprises a first-stage integrating circuit and a second-stage integrating circuit, and an operating principle of the single-path two-stage Σ-Δ modulator is similar to that of the single-path one-stage Σ-Δ modulator in FIG. 2 and shall not be described for brevity. Compared to other components, op-amps 502 and 504 as main components of the integrating circuit consume most resources of area and power consumption of an overall system. Through a current technique, a size of the second stage op-amp 504 (even op-amps after the second stage op-amp) is manufactured to be much smaller than that of the first stage op-amp 502, so as to effectively reduce area and power consumption of the overall system. However, the single-path two stage Σ-Δ modulator still has numerous disadvantages. For example, the first stage op-amp of an one-stage or multi-stage modulator is disadvantaged by having large area, high power consumption, and high cost; op-amps are operated only during a half of the clock cycle, and are left idle during another half of the clock cycle to cause a waste of resources.

In order to solve the foregoing problem that the op-amps are left idle, a technique of a two-stage integrating circuit sharing an op-amp is provided. FIG. 7 shows a single-path two-stage Σ-Δ modulator sharing an op-amp in the prior art. The single-path two-stage Σ-Δ modulator comprises an integrator 102, an integrator 104, and an op-amp 506 shared by the integrators 102 and 104. During a first period of a clock cycle, the op-amp 506 is connected to the integrator 102 to serve as a first-stage integrating circuit. During a second period of the clock cycle, the op-amp 506 is connected to the integrator 104 to serve as a second-stage integrating circuit. Operation details of the op-amp 506 connected to the integrator 102 or the integrator 104 are similar to those of the op-amp 500 of the single-path one-stage Σ-Δ modulator in FIG. 2, and shall not be described for brevity. The approach of sharing one op-amp by two stages of integrating circuits is capable of reducing the number of the op-amps as well as reducing area and power consumption of the overall system to some extent; nevertheless, a problem of crosstalk is incurred meanwhile.

FIG. 8 shows a schematic diagram of a two-stage integrating circuit with the shared op-amp 506, in which crosstalk is incurred. Under ideal circumstances, a gain of an op-amp under an ideal operating conditions approaches infinity, such that a voltage at a negative input end of the ideal op-amp equals a voltage at a positive input end. However, in practical applications, the gain and a bandwidth of the op-amp 506 are limited. During a first period of a clock cycle, when the op-amp 506 is connected to the integrating circuit CI, the first-stage integrating circuit performs integration, and at this point a residual voltage Vr is left at the negative input end of the op-amp 506, such that a parasitic capacitor Cr at the negative input end of the op-amp 506 is stored with an amount of residual charge Qr represented by Qr=Cr×Vr. Therefore, during a second period of the clock cycle, the residual charge Qr enters a second-stage integrating circuit to incur crosstalk, and thus a transfer function of the $\Sigma$-$\Delta$ modulator is changed to cause performance deterioration due to the noises.

In addition, in a two-stage integrating circuit that does not adopt the shared op-amp technique, since a size of an op-amp of a second-stage integrating circuit is already much smaller than that of an op-amp of a first-stage integrating circuit, the reduced amount of chip area is not obvious when the op-amp of the first-stage integrating circuit is shared by the second-stage integrating circuit. Accordingly, current various multi-paths multi-stage $\Sigma$-$\Delta$ modulators does not implement the op-amp sharing technique.

In conclusion, there is a need for a solution applying the op-amp sharing technique to a multi-path multi-stage $\Sigma$-$\Delta$ modulator to yield better overall performance.

SUMMARY OF THE INVENTION

An object of the present invention is to provide a multi-path $\Sigma$-$\Delta$ modulator with a shared op-amp and an associated auxiliary method.

Another object of the present invention is to provide a multi-path $\Sigma$-$\Delta$ modulator with a shared op-amp and an associated auxiliary method, so as to reduce area and power consumption of an SOC system.

Yet another object of the present invention is to provide a multi-path $\Sigma$-$\Delta$ modulator with a shared op-amp and an associated auxiliary method, so as to reduce crosstalk caused by the shared op-amp.

According to an embodiment of the present invention, a multi-path $\Sigma$-$\Delta$ modulator comprises a first integrator, a second integrator, a shared op-amp, two quantizers, two DACs, and a clock signal generator. The first integrator is coupled to a first path input end, and the second integrator is coupled to a second path input end. The shared op-amp is alternately coupled to the first and second integrators to generate an integrated signal. The quantizers, respectively coupled to the first and second integrators, compare the integrated signal with a predetermined signal to output a digital signal. The DACs, respectively coupled between output ends of the quantizers and the first and second integrators, convert the digital signal outputted by the quantizers into an analog that is fed to either the first integrator or the second integrator. The clock signal generator, coupled to the first integrator, the second integrator and the quantizers, provides clock signals for controlling the first integrator, the second integrator and the quantizers.

According to another embodiment of the present invention, a multi-path $\Sigma$-$\Delta$ modulator comprises a first integrator, a second integrator, a first shared op-amp, a third integrator, a fourth integrator, a second shared op-amp, two quantizers, two DACs, and a clock signal generator. The first integrator is coupled to a first path input end, and the second integrator is coupled to a second path input end. The first op-amp is alternately coupled to first and second integrators to generate a first integrated signal. The third integrator is coupled to the first path input end and the first shared op-amp, and the fourth integrator is coupled to the second path input end and the first shared op-amp. The second shared op-amp is alternately coupled to the third integrator and the fourth integrator to generate a second integrated signal according to the first integrated signal. The quantizers, respectively coupled to the third integrator and the fourth integrator, compare the second integrated signal with a predetermined signal to output a digital signal. The DACs, respectively coupled between output ends of the two quantizers and the first integrator, the second integrator, the third integrator and the fourth integrator, convert the digital signal outputted by the quantizers to an analog signal that is fed to either the first integrator and the third integrator or the second integrator and the fourth integrator. The clock generator, coupled to the first integrator, the second integrator, the third integrator, the fourth integrator and the quantizers, provides clock signals for the first integrator, the second integrator, the third integrator, the fourth integrator and the quantizers.

According to an embodiment of the present invention, a multi-path $\Sigma$-$\Delta$ modulating method for a multi-path $\Sigma$-$\Delta$ modulator with a shared op-amp is provided. The multi-path $\Sigma$-$\Delta$ modulator is inputted with two signals comprising a first input signal and a second input signal, and correspondingly outputs a first output signal and a second output signal. The auxiliary method comprises sampling the first input signal during a second period of a clock cycle to obtain a first sampled signal, and integrating the first sampled signal and a feedback signal of the first output signal during a first period of the clock cycle to obtain a first integrated signal; and sampling the second input signal during a first period of a clock cycle to obtain a second sampled signal, and integrating the second sampled signal and a feedback signal of the second output signal during a second period of the clock cycle to obtain a second integrated signal.

BRIEF DESCRIPTION OF THE DRAWINGS

The following description and figures are disclosed to gain a better understanding of the advantages of the present invention.

DETAILED DESCRIPTION OF THE PREFERRED EMBODIMENT

Details of a multi-path Σ-Δ modulator with a shared op-amp and an associated auxiliary method are given in accordance with following embodiments of the invention.

Figure 1:
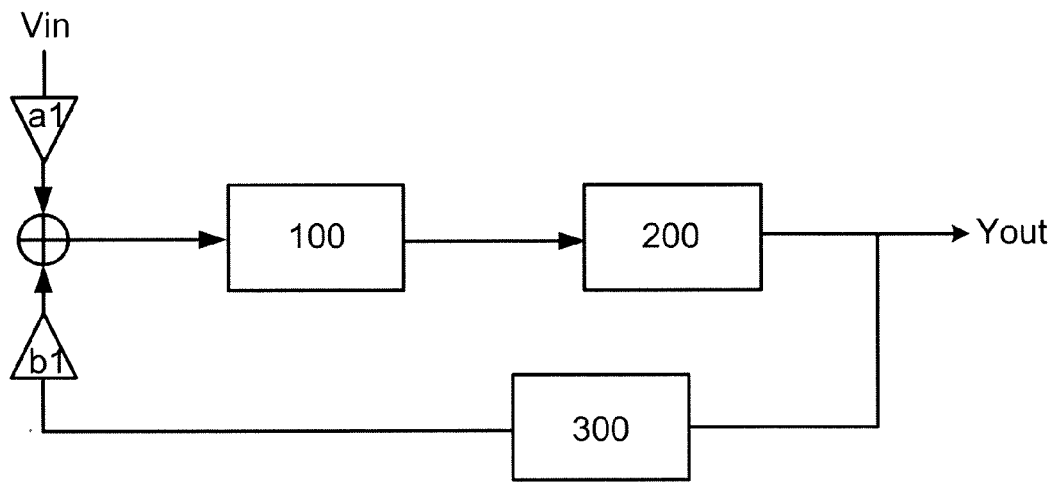
FIG. 1 is a schematic diagram of a single-path one-stage $\Sigma$-$\Delta$ modulator in the prior art.
Figure 2:
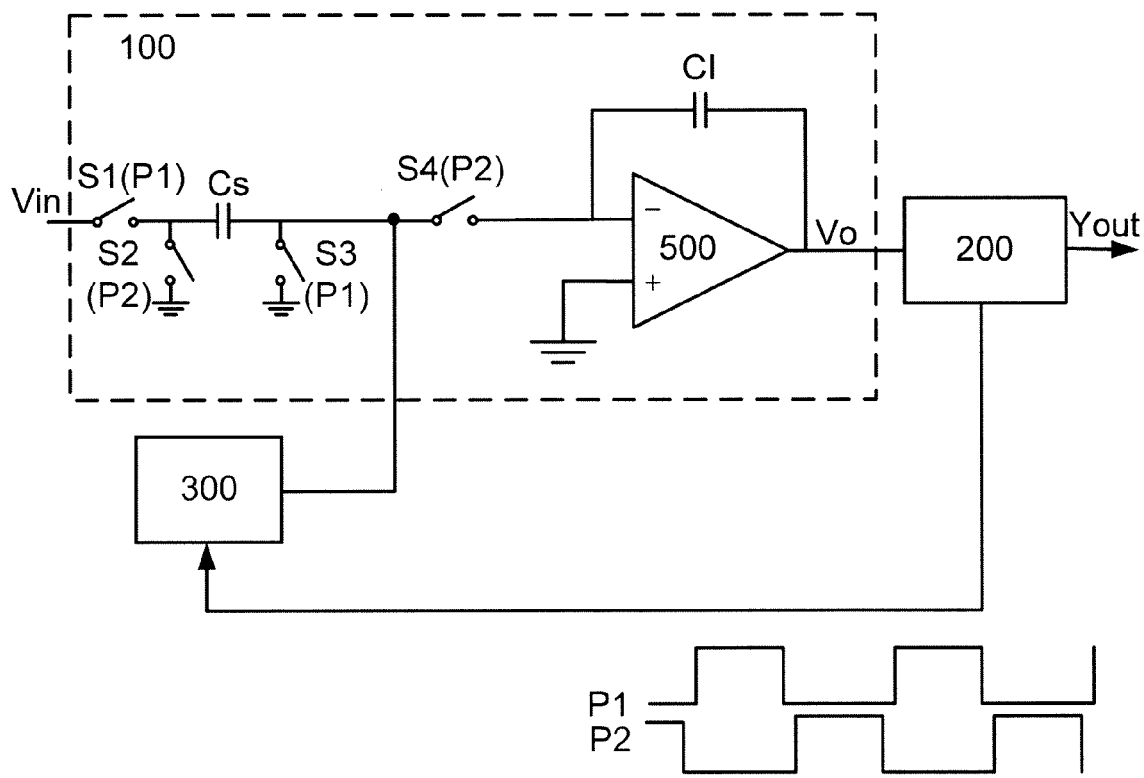
FIG. 2 to FIG. 4 are circuit diagrams of a conventional single-path one-stage $\Sigma$-$\Delta$ modulator.
Figure 3:
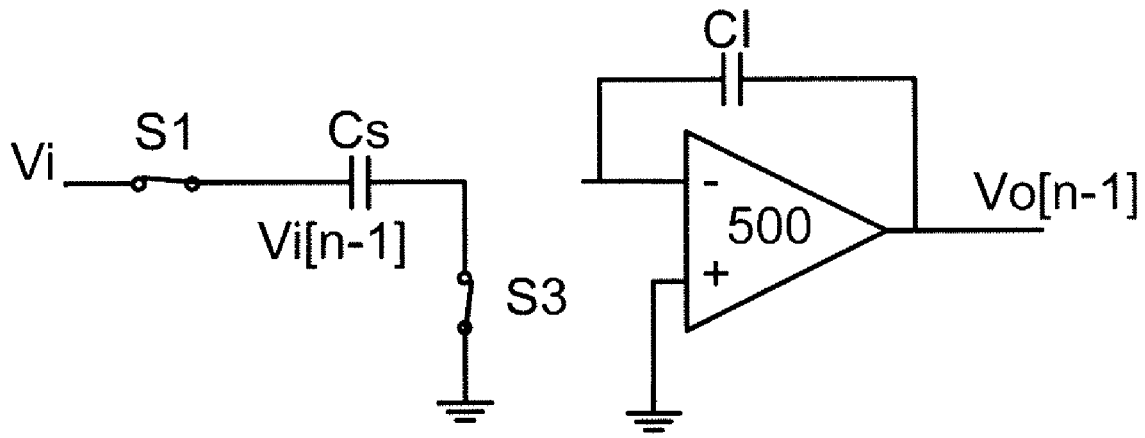
Figure 4:
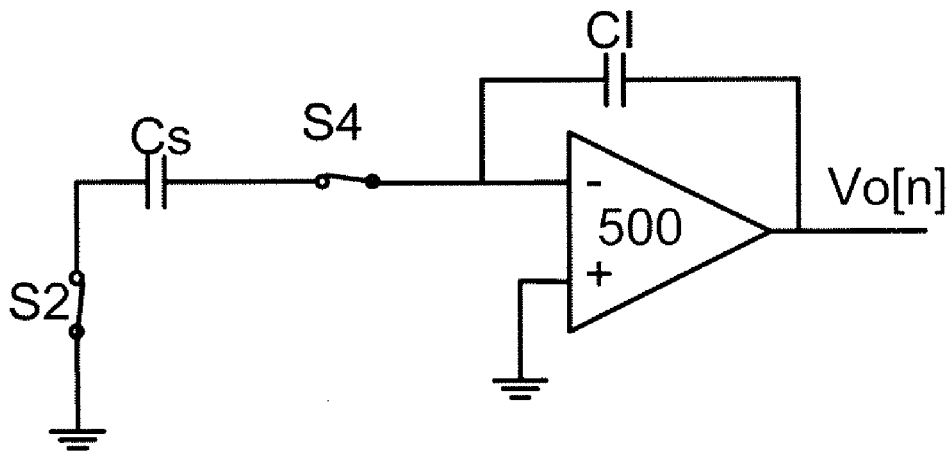
Figure 5:
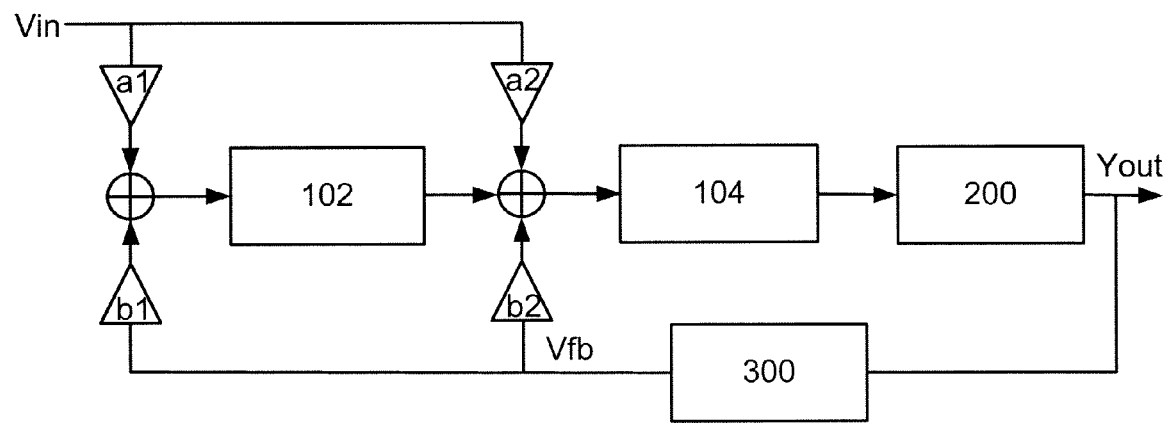
FIG. 5 and FIG. 6 are respectively schematic diagrams of a conventional single-path two-stage $\Sigma$-$\Delta$ modulator in the prior art.
Figure 6:
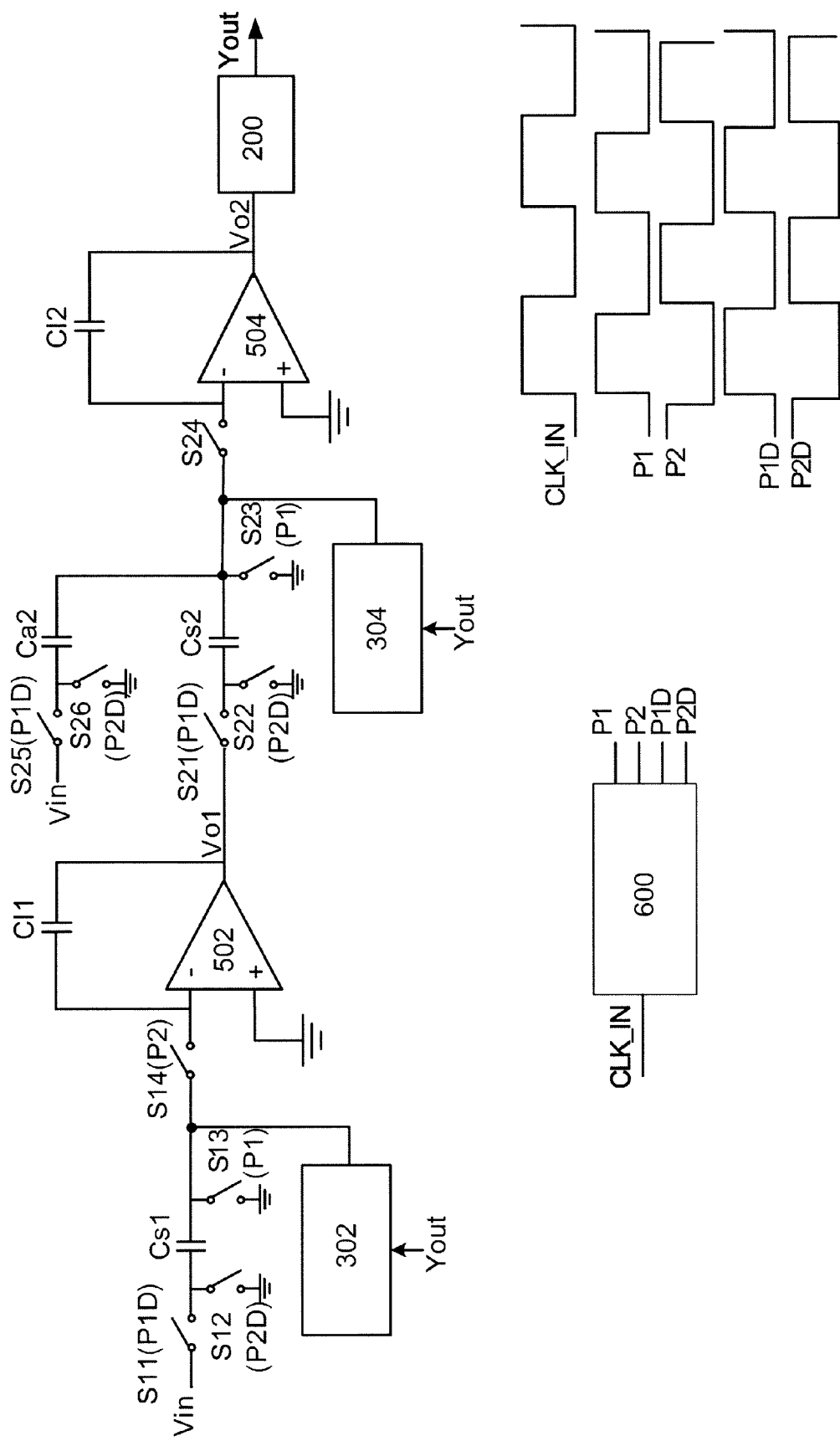
Figure 7:
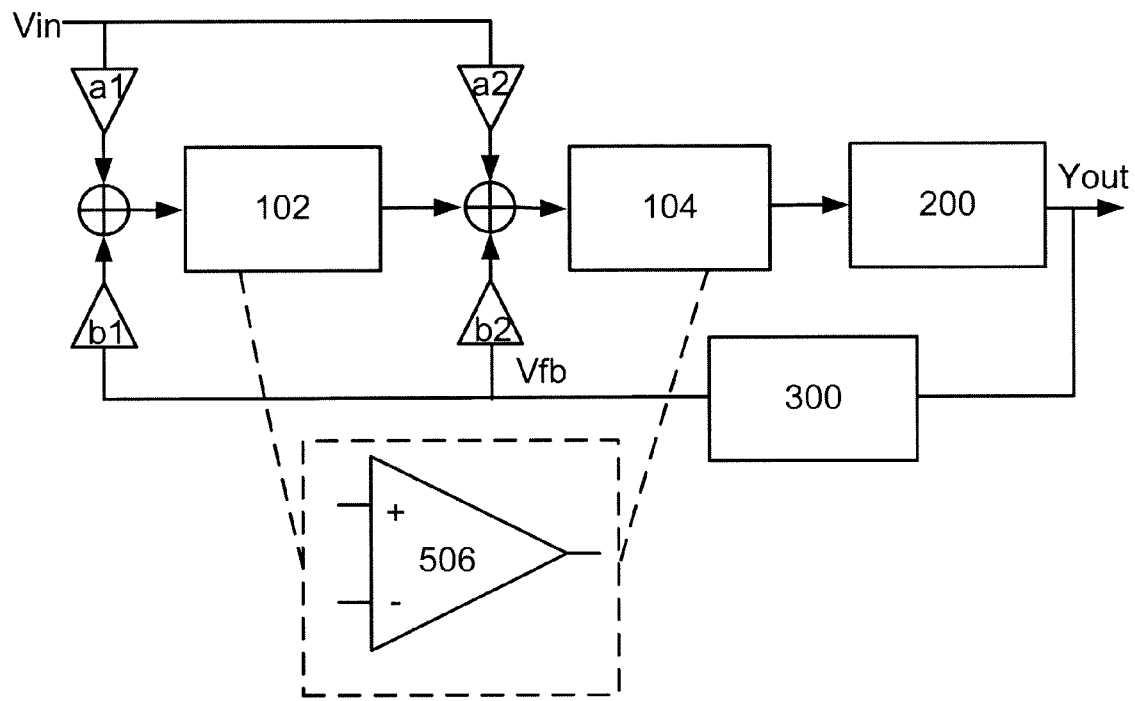
FIG. 7 is a circuit diagram of a conventional single-path two-stage $\Sigma$-$\Delta$ modulator with a shared op-amp.
Figure 8:
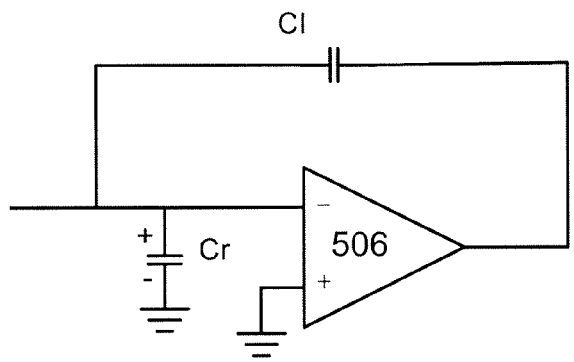
FIG. 8 is a schematic diagram of a two-stage integrating circuit with a shared op-amp in which crosstalk is incurred.
Figure 9:
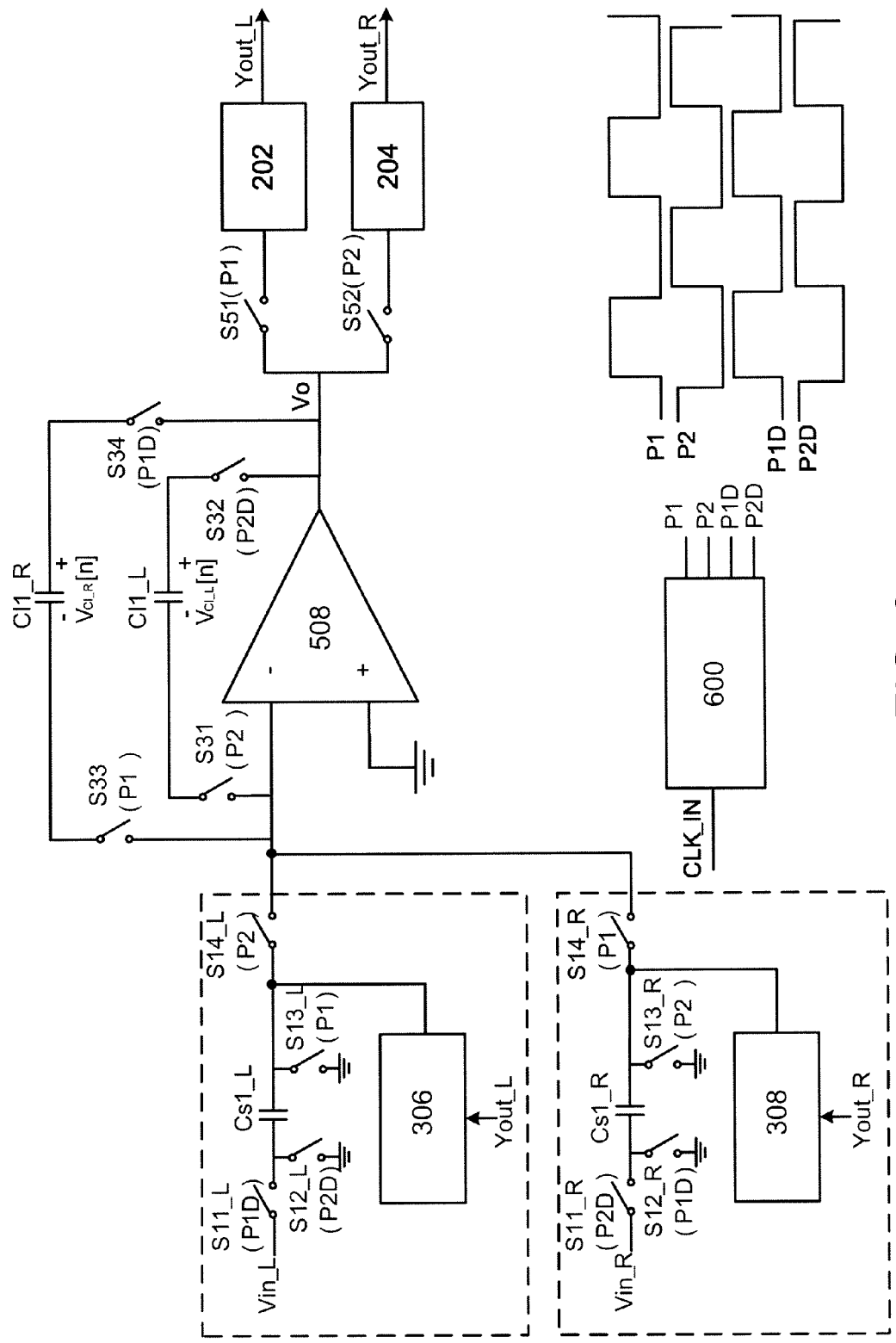
FIG. 9 is a circuit diagram of a two-path one-stage $\Sigma$-$\Delta$ modulator in accordance with a first embodiment of the present invention.

FIG. 9 shows a circuit diagram of a two-path one-stage Σ-Δ modulator in accordance with a first embodiment of the present invention. The two-path one-stage Σ-Δ modulator comprises two path input ends for respectively providing input signals Vin_L and Vin_R, an op-amp 508, two first-stage integrators (represented by a first integrator and a second integrator in the following description) sharing the op-amp 508, and two DACs 306 and 308 respectively corresponding to the two integrators. The first integrator that receives the input signal Vin_L comprises a sampling capacitor Cs1_L, an integrating capacitor CI1_L, and switches S11_L, S12_L, S13_L, S14_L, S31 and S32. The switches are respectively controlled by four clock signals P1, P2, P1D and P2D generated by a clock signal generator 600 (shown in FIG. 9). In this embodiment, the four clock signals P1, P2, P1D and P2D are respectively two groups of non-overlapped clock signals; preferably, the clock signal P1D has a delay compared to the clock signal P1, and the clock signal P2D has a delay compared with the clock signal P2. Waveforms of the four clock signals are shown in FIG. 9. When the clock signals P1 and P1D are at a high level, the input signal Vin_L flows into the sampling capacitor Cs1_L; and when the clock signals P2 and P2D are at a high level, the sampling capacitor Cs1_L is coupled to the negative input end of the op-amp 508, the integrating capacitor CI1_L is coupled to a negative input end and an output end of the op-amp 508. The switch S31 coupled between the negative input end of the op-amp 508 and the integrating capacitor CI1_L is controlled by the clock signal P2. The switch S32 coupled between the integrating capacitor CI1_L and the output end of the op-amp 508 is controlled by the clock signal P2D. The switch S11_L for controlling whether to forward the input signal Vin_L into the sampling capacitor Cs1_L is controlled by the clock signal P1D. The switch S12_L having one end coupled between the switch S11_L and the sampling capacitor Cs1_L and one end coupled to ground is controlled by the clock signal P2D. The switch S13_L having one end coupled between the sampling capacitor Cs1_L and the switch S14_L and one end coupled to ground is controlled by the clock signal P1. The switch S14_L coupled between the sampling capacitor Cs1_L and a negative input end of the op-amp 508 is controlled by the clock signal P2.

The second integrator that receives the input signal Vin_R comprises a sampling capacitor Cs1_R, an integrating capacitor CI1_R and switches S11_R, S12_R, S13_R, S14_R, S33 and S34. The switches are controlled by the four clock signals generated by the clock signal generator 600. When the clock signal P2 and the clock signal P2D are at a high level, the input signal Vin_R flows into the sampling capacitor Cs1_R; when the clock signal P1 and P1D are at a high level, the sampling capacitor Cs1_R is coupled to the negative input end of the op-amp 508, and the integrating capacitor CI1_R is coupled to the negative input end and the output end of the op-amp 508. The switch S33 coupled between the negative input end of the op-amp 508 and the integrating capacitor CI1_R is controlled by the clock signal P1. The switch S34 coupled between the integrating capacitor CI1_R and the output end of the op-amp 508 is controlled by the clock signal P1D. The switch S11_R for controlling whether to forward the input signal Vin_R into the sampling capacitor Cs1_R is controlled by the clock signal P2D. The switch S12_R having one end coupled between the switch S11_R and the sampling capacitor Cs1_R and one end coupled to ground is controlled by the clock signal P1D. The switch S13_R having one end coupled between the sampling capacitor Cs1_R and the switch S14_R and one end coupled to ground is controlled by the clock signal P2. The switch S14_R coupled between the sampling capacitor Cs1_R and the negative input end of the op-amp 508 is controlled by the clock signal P1.

A principle of the two-path one-stage Σ-Δ modulator in the first embodiment is described below.

During a first period of a clock cycle, the clock signals P1 and P1D are at a high level, the clock signals P2 and P2D are at a low level, the switches S13_L, S14_R, S33, S11_L, S12_R, S34 and S51 are closed, and the switches S14_L, S13_R, S31, S12_L, S11_R S32 and S52 are open. For the first integrator, the input signal Vin_L flows into the sampling capacitor Cs1_L via the switches S11_L and S13_L, i.e., the sampling capacitor Cs1_L samples the input signal Vin_L, and a voltage between two ends of the integrating capacitor CI1_L stays unchanged. For the second integrator, since the sampling capacitor Cs1_R is charged during a previous period of the clock cycle, under the influence of the op-amp 508, charge stored in the sampling capacitor Cs1_R and charge of a feedback signal outputted by the DAC 308 are shifted to the integrating capacitor CI1_R via the switches S12_R, S14_R, S33 and S34. After the shifting is stabilized, an output signal of the op-amp 508 is denoted as Vo_R.

During a second period of the clock cycle, the clock signals P1 and P1D are at a low level, the clock signals P2 and P2D are at a high level, switches S13_L, S14_R, S33, S11_L, S12_R, S34 and S51 are open, and switches S14_L, S13_R, S31, S12_L, S11_R, S32 and S52 are closed. For the first integrator, since the sampling capacitor is charged during the first period of the clock cycle, under the influence of the op-amp 508, charge stored in the sampling capacitor Cs1_L and charge of a feedback signal outputted by the DAC 306 are shifted to the integrating capacitor CI1_L via the switches S12_L, S14_L, S31 and S32. After the shifting is stabilized, an output signal Vo of the op-amp 508 is denoted as Vo_L. For the second integrator, the input signal Vin_R flows into the sampling capacitor Cs1_R via the switches S11_R and S13_R, i.e., the sampling capacitor Cs1_R samples the input signal Vin_R, and a voltage between two ends of the integrating capacitor CI1_R stays unchanged.

Referring to FIG. 9, two quantizers 202 and 204, respectively coupled to the integrators via switches S51 and S52, compares the output signal Vo_L or Vo_R of the op-amp 508 with a predetermined signal to output a digital signal Yout_L or Yout_R. The DAC 306 receives and converts the digital signal Yout_L into an analog signal that is fed to the first integrator, and the DAC 308 receives and converts the digital signal Your_R into an analog signal that is fed to the second integrator. Structures of the quantizers 202 and 204 and DACs 306 and 308 are readily apparent to a person having ordinary skills in the art, and shall not be described for brevity.

As observed for the foregoing description, the output signal of the two-path one-stage Σ-Δ modulator is Yout_R during the first period of the clock cycle, and the output signal of the two-path one-stage Σ-Δ modulator is Yout_L during the second period of the clock cycle. In this embodiment, the op-amp 508 alternately operates for the two integrators during one complete clock cycle, and thus utilization efficiency of the op-amp 508 is effectively increased.

Figure 10:
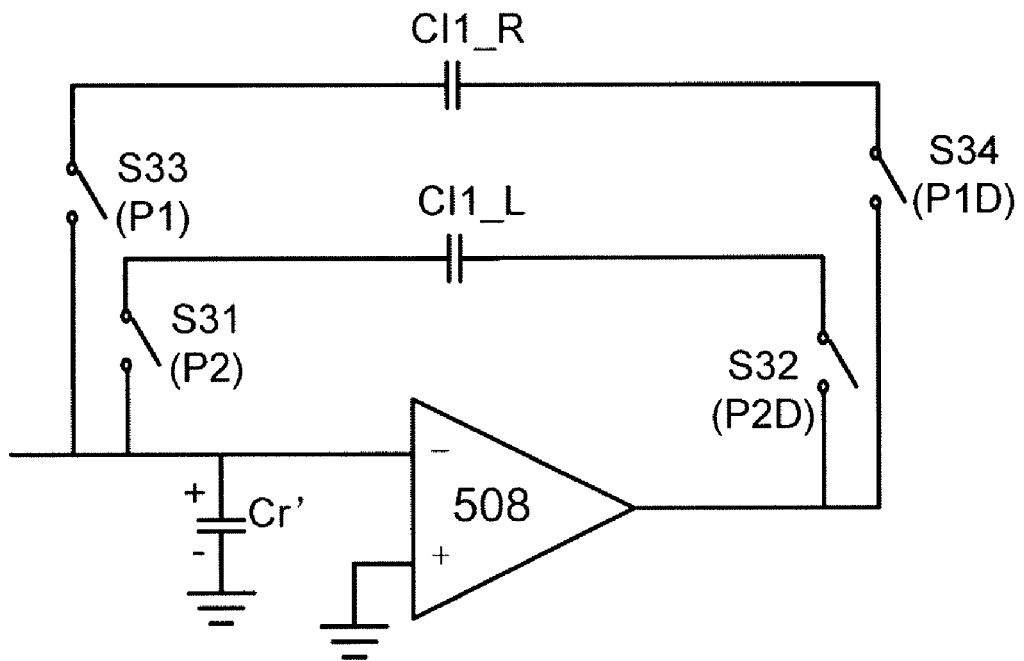
FIG. 10 is a schematic diagram of a shared op-amp in which crosstalk exists in accordance with the second embodiment of the present invention.

However, crosstalk may be incurred from sharing an op-amp by two independent integrators. FIG. 10 shows a schematic diagram of the shared op-amp 508 incurring crosstalk in accordance with the first embodiment of the present invention. Under ideal circumstances, since a gain of the op-amp 508 in ideal operating conditions approximate infinity, a voltage at the negative input end of the op-amp equals a voltage at the positive input end of the op-amp 508. However, in practical applications, the gain and bandwidth of the op-amp 508 are limited. Therefore, during the first period of the clock cycle, when the op-amp 508 is connected to the integrating capacitor CI1_R, the second integrator performs integration. At this point, a residual voltage Vr' is left at the negative input end of the op-amp 508 (shown in FIG. 10), such that a parasitic capacitor Cr' at the negative input end of the op-amp 508 is stored with an amount of residual charge Qr' represented by Qr'=Cr'×Vr'. Therefore, during the second period of the clock cycle, the residual charge Qr enters the first integrator to generate crosstalk. Meanwhile, there are other imperfect factors in the circuits, e.g., charge injection of opening the switches S32 and S34 that may also incur crosstalk. In order to solve the problem of incurring crosstalk due to the shared op-amp, various solutions are provided below.

In a first solution, delayed clocks are implemented to operate the switches, i.e., to close or open the switches. Since charge may be injected at the instant that the switches are opened, during the first period of the clock cycle, when a connection between the second integrator and the op-amp 508 is open, charge is injected into the parasitic capacitor Cr' at the negative input end of the op-amp 508. Accordingly, during the second period of the clock cycle, the injected charge flows into the first integrator to incur crosstalk. In order to solve the problem, delayed clocks are implemented. That is, referring to FIG. 10, the switch S31 is coupled between the negative input end of the op-amp 508 and the integrating capacitor CI1_L, the switch S32 is coupled between the integrating capacitor CI1_L and the output end of the op-amp 508, the switches S31 and S32 are simultaneously closed, but the switch S31 is opened before the switch S32 is opened. Since the charge injection through the switch S31 is constant and the charge injection through the switch S32 is signal correlated, when the switch S31 is opened before the switch S32 is, the signal correlated charge through the switch S32 is not induced to the parasitic capacitor Cr', such that the crosstalk brought by the switches is also reduced. Likewise, the switch S33 is coupled between the negative input end of the op-amp 508 and the integrating capacitor CI1_R, the switch S34 is coupled between the integrating capacitor CI1_R and the output end of the op-amp 508, the switch S33 and the switch S34 are simultaneously closed, but the switch S33 is opened before the switch S34 is opened. Generally, the delay time is determined according to actual situations, and in this embodiment, the delay time is 100 ps. It is to be noted that, the two groups of delayed clocks are optional factors of the Σ-Δ modulator, i.e., only the two non-overlapped clock signals P1 and P2 may also be used for controlling the switches.

Figure 11:
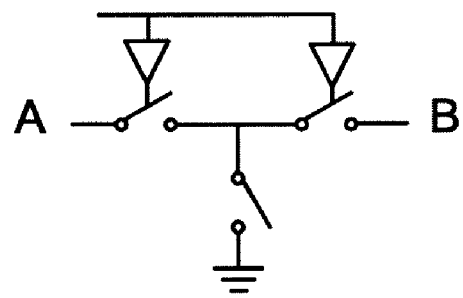
FIG. 11 is a schematic diagram of a T-type switch.

In a second solution, T-type switches are adopted. FIG. 11 shows a schematic diagram of a T-type switch. When the switches S31 and S33 in FIG. 10 are T-type switches in FIG. 11, the switch S31 or the switch S33 has an end A and an end B respectively coupled to the negative input end of the op-amp 508 and the integrating capacitor CI1_L or the integrating capacitor CI1_R, a third end coupled to ground (i.e., a voltage level at the third end equals that at the positive input end of the op-amp 508), and a fourth end coupled to the clock generator 600 (i.e., the switch S31 or the switch S33 is controlled by the clock signals). Accordingly, the switches S31 and S33 are coupled to ground when being opened, and thus the integrating capacitors CI1_L and CI1_R become better isolated from the op-amp 508 to reduce crosstalk. Likewise, when the switches S32 and S34 are T-type switches, the crosstalk between integrators are reduced even more effectively.

In a third solution, a gain and a bandwidth of the shared op-amp are appropriately increased. While a voltage difference between the negative input end and the positive input end of the op-amp 508 becomes smaller as the gain of the bandwidth of the shared op-amp approximate infinity as in the ideal operating conditions, the residual charge stored in the parasitic capacitor Cr' (as shown in FIG. 10) also becomes less, which means that crosstalk caused by the residual charge is significantly reduced.

Each of the foregoing solutions for eliminating crosstalk may be separately used or be combined with one another. For example, the solutions of using T-type switches and increasing the gain and bandwidth of the op-amp may be simultaneously applied.

In addition, the sharing technique of an op-amp according to the present invention is not only applied to the two-path one-stage Σ-Δ modulator, but also applied to multi-path two-stage Σ-Δ modulators.

Figure 12:
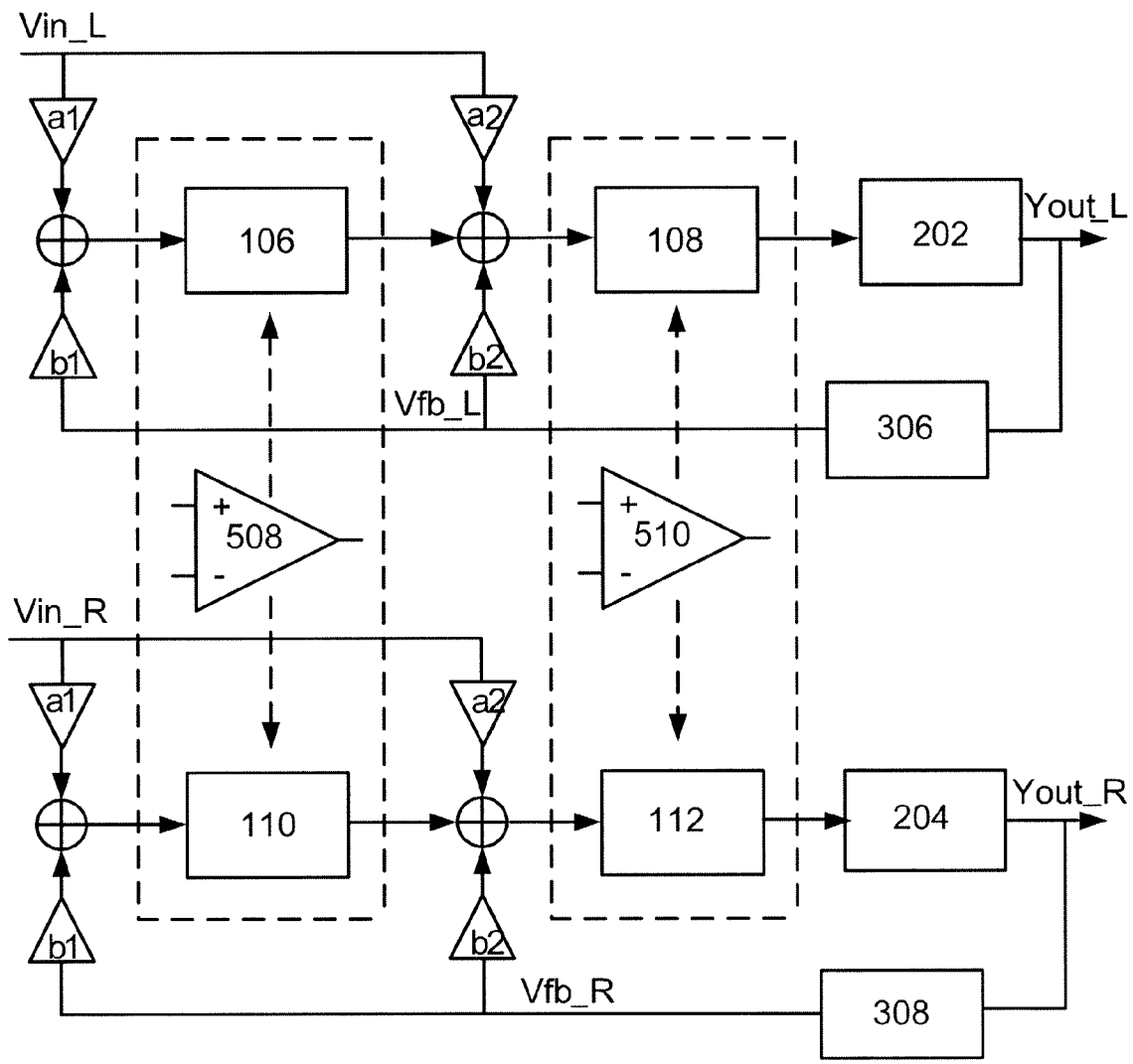
FIG. 12 is a principle of a two-path two-stage $\Sigma$-$\Delta$ modulator in accordance with a first embodiment of the present invention.

FIG. 12 shows a schematic diagram of a two-path two-stage Σ-Δ modulator in accordance with a second embodiment of the present invention. The two-path two-stage Σ-Δ modulator comprises a first-stage integrating circuit, a second-stage integrating circuit connected to the first-stage integrating circuit, two quantizers 202 and 204 respectively coupled to the second-stage integrating circuit, two DACs 306 and 308 respectively coupled to the two quantizers 202 and 204, and a clock signal generator (not shown). The first-stage integrating circuit comprises two integrators 106 and 110, and two adders (i.e., a first adder and a second adder) respectively coupled to the integrators 106 and 110. The integrators 106 and 110 share an op-amp 508. It is to be noted that, since the two quantizers 202 and 204, two DACs 306 and 308, and the op-amp 508 in this embodiment are respectively of the same functions as those in the first embodiment, they're designated by same numbers for illustration purposes. The second-stage integrating circuit comprises two integrators 108 and 112, and two adders (i.e., a third adder and a fourth adder) respectively coupled to the integrators 108 and 112. The integrators 108 and 112 share an op-amp 510. The integrator 108 is coupled to the integrator 106 via the third adder, and the integrator 112 is coupled to the integrator 110 via the fourth adder. In FIG. 12, a1, a2, b1 and b2 are gain factors, and are indicated for illustration purposes. The principle of the two-path two-stage Σ-Δ modulator is described below. The first adder subtracts two products of respectively multiplying an input signal Vin_L and a feedback signal Vfb_L outputted by the DVC 306 by the gain factors a1 and b1 to obtain an output signal (i.e., a1*Vin_L−b1*Vfb_L)) of the first adder. The integrator 106 receives and integrates the output signal of the first adder to obtain an integrated signal Vo1_L that is transmitted to the third adder. The third adder subtracts two products of respectively multiplying the input signal Vin_L and the feedback signal Vfb_L outputted by the DAC 306 by the gain factors a2 and b2 to obtain a result, and adds the result to the integrated signal Vo1_L to obtain an output signal (i.e., Vo1_L+a2*Vin_L−b2*Vfb_L) of the third adder. The integrator 108 receives and integrates the output signal of the third adder to obtain an integrated signal Vo2_L that is transmitted to the quantizer 202. The quantizer 202 compares the integrated signal Vo2_L with a predetermined signal to output a digital signal Yout. The DAC 306 receives and converts the digital signal Yout outputted by the quantizer 202 into an analog signal (i.e., the feedback signal) Vfb_L that is then fed to the first-stage integrating circuit and the second-stage integrating circuit. For an input signal Vin_R, the second adder subtracts two products of respectively multiplying the input signal Vin_R and a feedback signal Vfb_R outputted by the DAC 308 by the gain factors a1 and b1 to obtain an output signal (i.e., a1*Vin_R−b1*Vfb_R) of the second adder. The integrator 112 receives and integrates the output signal of the second adder to obtain an integrated signal Vo1_R that is transmitted to the fourth adder. The fourth adder subtracts two products of multiplying the input signal Vin_R and the feedback signal outputted by the DAC 308 by the gain factors a2 and b2 to obtain a result, and adds the result to the integrated signal Vo1_R so as to obtain an output signal (i.e., Vo_R+ a2*Vin_R−b2*Vfb_R) of the fourth adder. The integrator 112 receives and integrates the output signal of the fourth adder into an integrated signal Vo2_R that is transmitted to the quantizer 204. The quantizer 204 compares the integrated signal Vo2_R with a predetermined signal to output a digital signal Yout. The DAC 308 receives and converts the digital signal Yout outputted by the quantizer 204 into an analog signal (i.e., the feedback signal) Vfb_R that is then fed to the first-stage integrating circuit and the second-stage integrating circuit.

Figure 13:
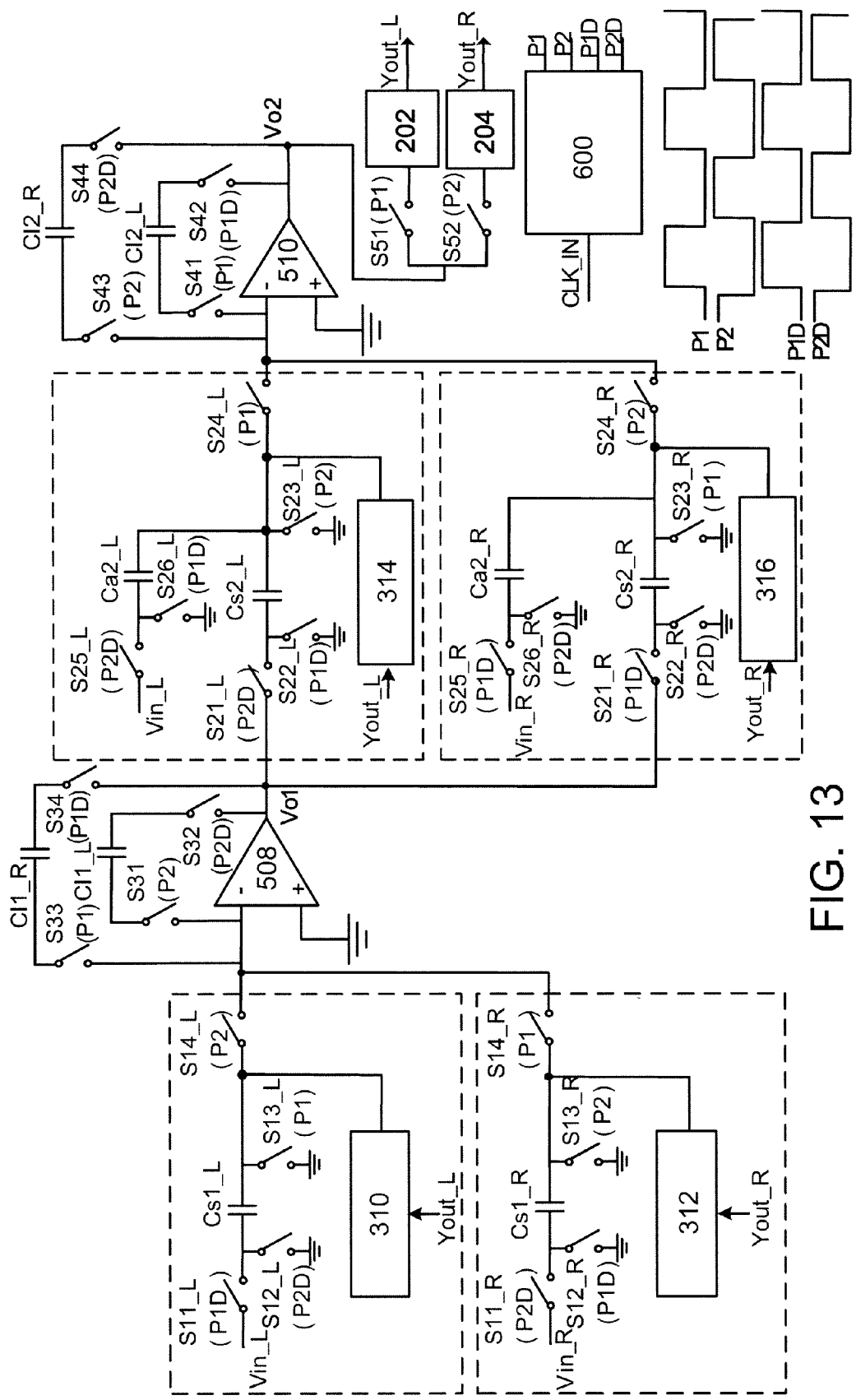
FIG. 13 to FIG. 15 are circuit diagrams of the two-path two-stage $\Sigma$-$\Delta$ modulator in accordance with the first embodiment of the present invention.

FIG. 13 shows a circuit diagram of the two-path two-stage Σ-Δ modulator in accordance with the second embodiment of the present invention. The first-stage integrating circuit comprises two path input ends for respectively providing two input signals Vin_L and Vin_R, the op-amp 508, two first-stage integrators (i.e., a first integrator and a second integrator in the following description) sharing the op-amp 508, and DACs 310 and 312 respectively corresponding to the first integrator and the second integrator. The first integrator that receives the input signal Vin_L comprises a sampling capacitor Cs1_L, an integrating capacitor CI1_L, and switches S11_L, S12_L, S13_L, S14_L, S31 and S32. The foregoing switches are controlled by four clock signals P1, P2, P1D and P2D generated by a clock signal generator 600 as shown in FIG. 13. In this embodiment, the four clock signals P1, P2, P1D and P2D are non-overlapped clock signals. Preferably, the delayed clock signals P1D/P2D are similar but with a slight delay compared with the clock signals P1/P2. Waveforms of the four clock signals are shown in FIG. 13. When the clock signals P1 and P1D are at a high level, the input signal Vin_L flows into the sampling capacitor Cs1_L. When the clock signals P2 and P2D are at a high level, the sampling capacitor Cs1_L is coupled to a negative input end, and the sampling capacitor CI1_l is coupled to the negative input end and an output end of the op-amp 508. The switch S31 coupled between the negative input end of the op-amp 508 and the integrating capacitor CI1_L is controlled by the clock signal P2. The switch S32 coupled between the integrating capacitor CI1_L and the output end of the op-amp 508 is controlled by the clock signal P2D. The switch S11_L for controlling whether to forward the input signal Vin_L into the sampling capacitor Cs1_L is controlled by the clock signal P1D. The switch S12_L having one end coupled between the switch S11_L and the sampling capacitor Cs1_L and one end coupled to ground is controlled by the clock signal P2D. The switch S13_L having one end coupled between the sampling capacitor Cs1_L and the switch S14_L and one end coupled to ground is controlled by the clock signal P1. The switch S14_L coupled between the sampling capacitor Cs1_L and the negative input end of the op-amp 508 is controlled by the clock signal P2. The second integrator of the first-stage integrating circuit that receives the input signal Vin_R comprises a sampling capacitor Cs1_R, an integrating capacitor CI1_R, and switches S11_R, S12_R, S13_R, S14_R, S33 and S34. The switches are respectively controlled by the four clock signals generated by the clock signal generator 600. When the clock signals P2 and P2D at a high level, the input signal Vin_R flows into the sampling capacitor Cs1_R; when the clock signals P1 and P1D are at a high level, the sampling capacitor Cs1_R is coupled to the negative input end of the op-amp 508, and the integrating capacitor CI1_R is coupled to the negative input end and the output end of the op-amp 508. The switch S33 coupled between the negative input end of the op-amp 508 and the integrating capacitor CI1_R is controlled by the clock signal P1. The switch S34 coupled between the integrating capacitor CI1_R and the output end of the op-amp 508 is controlled by the clock signal P1D. The S11_R for controlling whether to forward the input signal Vin_R into the sampling capacitor Cs1_R is controlled by the clock signal P2D. The switch S12_R having one end coupled between the switch S11_R and the sampling capacitor Cs1_R and one end connected to ground is controlled by the clock signal P1D. The switch S13_R having one end coupled between the sampling capacitor Cs1_R and the switch S14_R and one end connected to ground is controlled by the clock signal P2. The switch S14_R coupled between the sampling capacitor Cs1_R and the negative input end of the op-amp 508 is controlled by the clock signal P1.

The second-stage integrating circuit comprises two path input ends for respectively providing two input signals Vin_L and Vin_R, an op-amp 510, two second-stage integrators (i.e., a third integrator and a fourth integrator in the following description) sharing the op-amp 508, and DACs 314 and 316 respectively corresponding to the third integrator and the fourth integrator. The third integrator receives the input signal Vin_L and is coupled to the output end of the op-amp 508. The third integrator comprises a sampling capacitor Cs2_L, an integrating capacitor CI2_L, a sampling capacitor Ca2_L, and switches S21_L, S22_L, S23_L, S24_L, S25_L, S26_L, S41 and S42. The foregoing switches are respectively controlled by the four clock signals generated by the clock signal generator 600. When the clock signals P2 and P2D are at a high level, the output signal Vo1 outputted by the op-amp 508 flows into the sampling capacitor Cs2_L, and the input signal Vin_L flows into the sampling capacitor Ca2_L. When clock signals P1 and P1D are at a high level, the sampling capacitors Cs2_L and Ca2_L are coupled to a negative input end of the op-amp 510, and the integrating capacitor CI2_L is coupled to the negative input end and an output end of the op-amp 510. The switch S41 coupled between the negative input end of the op-amp 510 and the integrating capacitor CI2_L is controlled by the clock signal P1. The switch S42 coupled between the integrating capacitor CI2_L and the output end of the op-amp 510 is controlled by the clock signal P1D. The switch S21_L for controlling whether to forward the output signal Vo1 outputted by the op-amp 508 into the sampling capacitor Cs2_L is controlled by the clock signal P2D. The switch S22_L having one end coupled between the switch S21_L and the capacitor Cs2_L and one end coupled to ground is controlled by the clock signal P1D. The switch S23_L having one end coupled between the capacitor Cs2_L and the switch S24_L and one end coupled to ground is controlled by the clock signal P2. The switch S24_L coupled between the sampling capacitor Cs2_L and the negative input end of the op-amp 510 is controlled by the clock signal P1. The switch S25_L for controlling whether to forward the input signal Vin_L into the sampling capacitor Ca2_L is controlled by the clock signal P2D. The switch S26_L having one end coupled between the switch S25_L and the sampling capacitor Ca2_L and one end coupled to ground is controlled by the clock signal P1D. The fourth integrator that receives the input signal Vin_R comprises a sampling capacitor Cs2_R, an integrating capacitor CI2_R, a sampling capacitor Ca2_R, switches S21_R, S22_R, S23_R, S24_R, S25_R, S26_R, S43, and S44. The switches are also controlled by the four clock signals generated by clock signal generator 600. When the clock signal P1 and P1D are at a high level, the output signal Vo1 of the op-amp 508 flows into the sampling capacitor Cs2_R, and the input signal Vin_R flows into the sampling capacitor Ca2_R. When the clock signals P2 and P2D are at a high level, the sampling capacitors Cs1_R and Ca2_R are coupled to the negative input end of the op-amp 510, and the integrating capacitor CI2_R is coupled to the negative input end and the output end of the op-amp 510. The switch S43 coupled between the negative input end of the op-amp 510 and the integrating capacitor CI2_R is controlled by the clock signal P2. The switch S44 coupled between the integrating capacitor CI2_R and the output end of the op-amp 510 is controlled by the clock signal P2D. The switch S21_R controlling whether to forward the output signal Vo1 of the op-amp 508 into the sampling capacitor Cs2_R is controlled by the clock signal P1D. The switch S22_R having one end coupled between the switch S21_R and the sampling capacitor Cs2_R and one end coupled to ground is controlled by the clock signal P2D. The switch S23_R having one end coupled between the capacitor Cs2_R and the switch S24_R and one end coupled to ground is controlled by the clock signal P1. The switch S24_R coupled between the sampling capacitor Cs2_R and the negative input end of the op-amp 510 is controlled by the clock signal P2. The switch S25_R for controlling whether to forward the input signal Vin_R to the sampling capacitor Ca2_R is controlled by the clock signal P1D. The switch S26_R having one end coupled between the switch S25_R and the sampling capacitor Ca2_R and one end coupled to ground is controlled by the clock signal P2D.

The two-path two-stage Σ-Δ modulator in FIG. 13 further comprises two quantizers 202 and 204 respectively connected to the second-stage integrating circuit via switches S51 and S52. The quantizers 202 and 204 compare an output signal Vo2 outputted by the op-amp 510 of the second-stage integrating circuit with a predetermined signal to output a digital signal Yout_L or Yout_R. The DACs 310 and 314 respectively receive and convert the digital signal Yout_L into an analog signal that is fed to the first integrator and the third integrator. The DACs 312 and 316 respectively receive and convert the digital signal Yout_R into an analog signal that is fed to the second integrator and the fourth integrator. Structures of the quantizers 202 and 204 and the DACs 310, 312, 314 and 316 are readily apparent to a person having ordinary skills in the art, and shall not be described for brevity.

Referring to FIG. 13, the clock signals P1 and P2, and the clock signals P1D and P2D are two groups of non-overlapped clock signals. In this embodiment, the clock signal P1D is delayed by 100 ps compared with the clock signal P1, and the clock signal P2D is delayed by 100 ps compared with the clock signal P2. The structure of the control signal generator 600 is readily apparent to a person having ordinary skills in the art, and shall not be described for brevity.

The principle of the two-path two-stage Σ-Δ modulator is described below.

Figure 14:
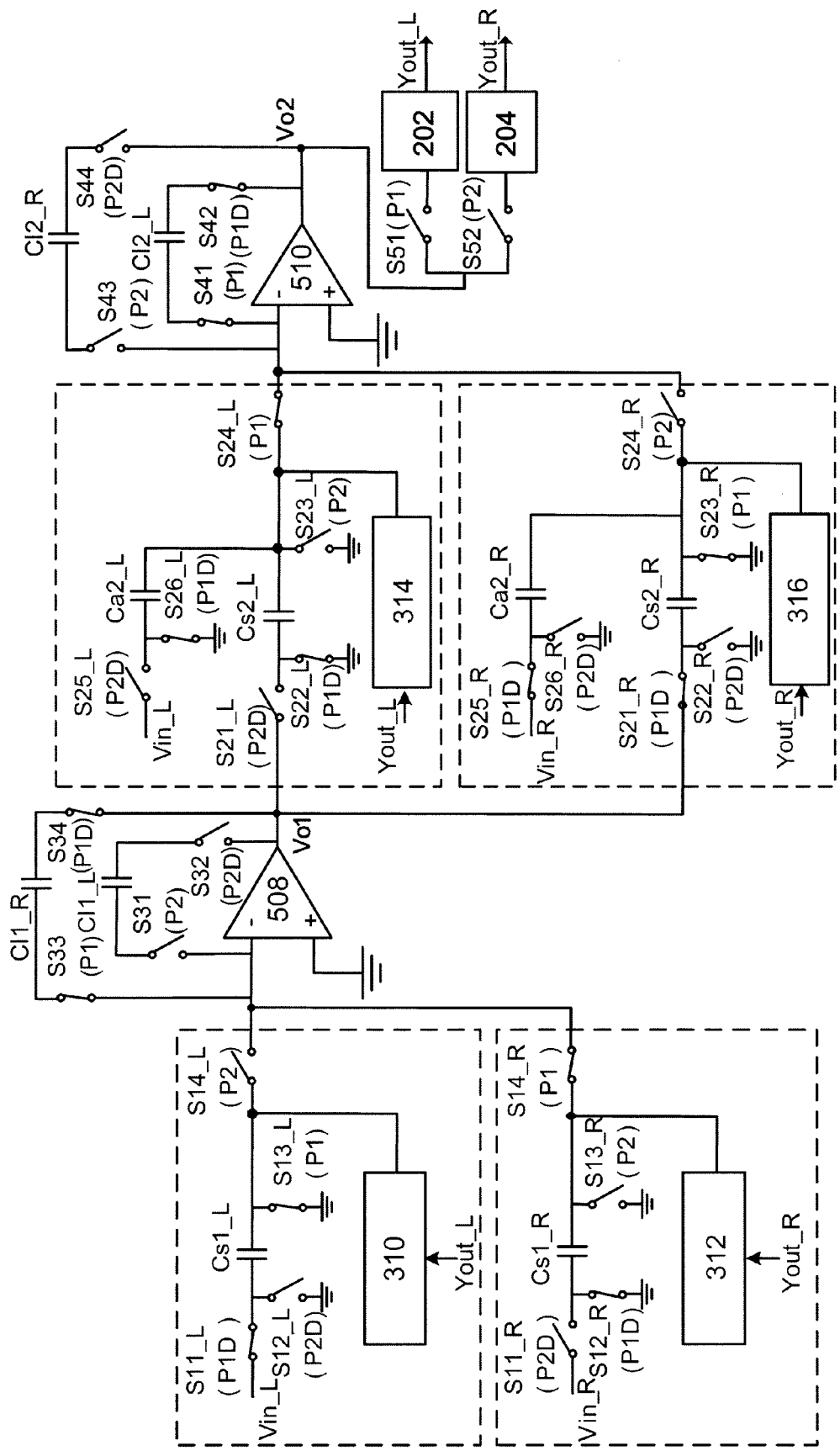

FIG. 14 shows a circuit diagram of the two-path two-stage Σ-Δ modulator in FIG. 13 during a first period of a clock cycle in accordance with the second embodiment of the present invention. During the first period of the clock cycle, the clock signals P1 and P1D are at a high level, the clock signals P2 and P2D are at a low level, the switches S13_L, S14_R, S33, S24_L, S23_R, S41, S11_L, S12_R, S34, S22_L, S26_L, S21_R, S25_R, S42 and S51 are closed, and the switches S14_L, S13_R, S31, S23_L, S24_R, S43, S12_L, S11_R, S32, S21_L, S25_L, S26_R, S22_R, S44 and S52 are open. Relative positions of the foregoing switches and components are identical to those in FIG. 10, and shall not be described for brevity. For the first integrator, the input signal Vin_L flows into the sampling capacitor Cs1_L via the switch S11_L and the switch S13_L, i.e., the sampling capacitor Cs1_L samples the input signal Vin_L. For the second integrator, since the sampling capacitor Cs1_R is charged during a previous period of the clock cycle, under the influence of the op-amp 508, charge stored in the sampling capacitor Cs1_R and charge of a feedback signal outputted by the DAC 312 are shifted to the integrating capacitor CI1_R via the switches S12_R, S14_R, S33 and S34. After the shifting is stabilized, an output signal Vo1 of the op-amp 508 is denoted as Vo1_R. For the third integrator, since the sampling capacitor Ca2_L and the sampling capacitor Cs2_L are charged during the previous period of the clock cycle, under the influence of the op-amp 510, charge stored in the sampling capacitor Ca2_L and the sampling capacitor Cs2_L and charge of a feedback signal outputted by the DAC 314 are shifted to the integrating capacitor CI2_L via the switches S26_L, S22_L, S24_L, S41 and S42. After the shifting is stabilized, an output signal Vo2 of the op-amp 510 is denoted as Vo2_L. For the fourth integrator, the output signal Vo1_R of the op-amp 508 flows into the sampling capacitor Cs2_R via the switches S21_R and S23_R, i.e., the sampling capacitor Cs2_R samples the output signal Vo1_R of the op-amp 508. At this point, the input signal Vin_R flows into the sampling capacitor Ca2_R via the switches S25_R and S23_R, i.e., the sampling capacitor Ca2_R samples the input signal Vin_R. Since the switch S51 is closed, the output signal Vo2_L of the op-amp 510 is quantized by the quantizer 202 to generate an output signal Yout_L, which is first converted by the DACs 310 and 314 and is then respectively fed to the first integrator and the third integrator.

Figure 15:
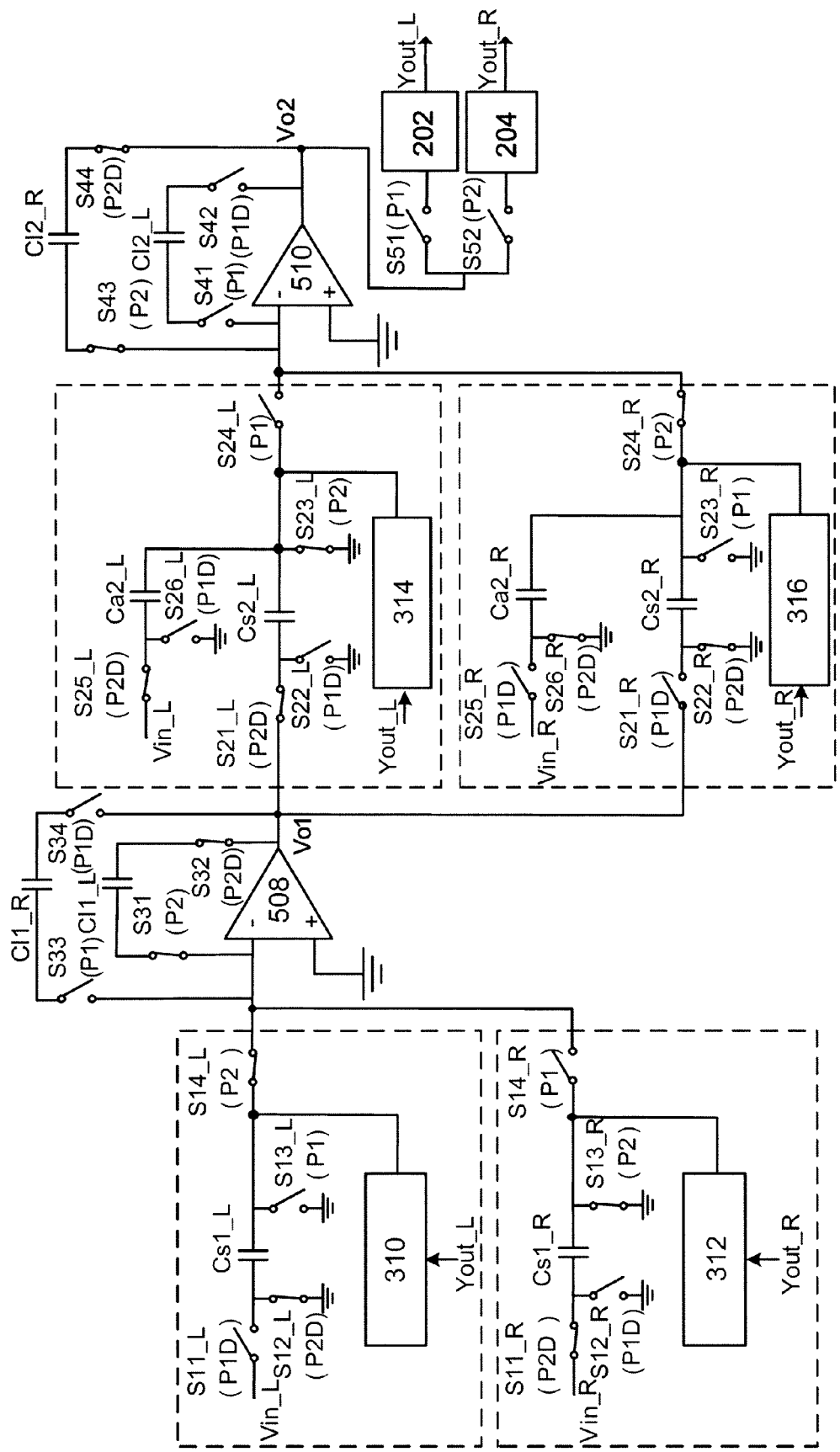

FIG. 15 shows circuits of the two-path two-stage Σ-Δ modulator in FIG. 13 during a second period of the clock cycle in accordance with the second embodiment of the present invention. During the second period of the clock cycle, the clock signals P1 and P1D are at a low level, P2 and P2D are at a high level, the switches S13_L, S14_R, S33, S24_L, S23_R, S41, S11_L, S12_R, S34, S22_L, S26_L, S21_R, S25_R, S42, and S51 are open, and the switches S14_L, S13_R, S31, S23_L, S24_R, S43, S12_L, S11_R, S32, S21_L, S25_L, S26_R, S22_R, S44 and S52 are closed. For the first integrator, since the sampling capacitor Cs1_L is charged during the first period of the clock period, under the influence of the op-amp 508, charge stored in the sampling capacitor Cs1_L and charge of a feedback signal outputted by the DAC 310 are shifted to the integrating capacitor CI1_L via the switches S12_L, S14_L, S31 and S32. After the shifting is stabilized, an output signal Vo1 of the op-amp 508 is denoted as Vo1_L. For the second integrator, the input signal Vin_R flows into the sampling capacitor Cs1_R via the switches S11_R and S13_R, i.e., the sampling capacitor Cs1_R samples the input signal Vin_R. For the third integrator, the output signal Vo1_L of the op-amp 508 flows into the sampling capacitor Cs2_L via the switches S21_L and S23_L, i.e., the sampling capacitor Cs2_L samples the output signal Vo1_L of the op-amp 508. At this point, the input signal Vin_L flows into the sampling capacitor Ca2_L via the switches S25_L and S23_L, i.e., the sampling capacitor Ca2_L samples the input signal Vin_L. For the fourth integrator, since the sampling capacitors Ca2_R and Cs2_R are charged during the first period of the clock cycle, under the influence of the op-amp 510, charge of the sampling capacitors Ca2_R and Cs2_R and charge of a feedback signal outputted by the DACs are shifted to the integrating capacitor CI2_R via the switches S26_R, S22_R, S24_R, S43 and S44, and an output signal of the op-amp 510 is denoted as Vo2_R. Since the switch S52 is closed, the output signal Vo2_R of the op-amp 510 is quantized by the quantizer 204 to generate an output signal Yout_R, which is first converted by the DACs 312 and 316 and is then respectively fed to the second integrator and the fourth integrator.

As mentioned above, according to the two-path two-stage Σ-Δ modulator provided by the present invention, only one integrator of each stage integrating circuit performs integration at a time, and meanwhile another integrator of the stage integrating circuit performs sampling.

Crosstalk may also be incurred from sharing an op-amp by two independent integrators. Since a gain of an op-amp in ideal operating conditions approximate infinity, a voltage at a negative input end of the op-amp equals a voltage at a positive input end of the op-amp. However, in practical applications, the gain and bandwidth of the op-amp 508 are limited. Therefore, in FIG. 14, during the first period of the clock cycle, when the op-amp 508 is connected to the integrating capacitor CI1_R, the second integrator of the first-stage integrating circuit performs integration. At this point, a residual voltage Vr' is left at the negative input end of the op-amp 508, such that a parasitic capacitor Cr' at the negative input end of the op-amp 508 is stored with an amount of residual charge Qr' represented by Qr'=Cr'×Vr'. Therefore, during the second period of the clock cycle, the residual charge Qr enters the first integrator and the second-stage integrating circuit to generate crosstalk. Meanwhile, there are other imperfect factors in the circuits, e.g., charge injection of opening the switches S32 and S34 that may also incur crosstalk. It is to be noted that, the crosstalk incurred in the first stage of integrators needs to be attended to most. The reason is that the Σ-Δ modulator has a noise shaping function, and influences on the Σ-Δ modulator caused by the crosstalk incurred at back-end stages are significantly reduced.

In this embodiment, the foregoing three solutions (i.e., implementing delayed clocks to operate the switches, adopting T-type switches, and appropriately increasing a gain and a bandwidth of the shared op-amp described in the first embodiment) may also adopted to solve the problem of incurring crosstalk due to the shared op-amp. Other than the foregoing three solutions, a gain factor a2 is brought. Influences of a feed-forward gain factor a2 are brought into each of the integrators of the second-stage integrating circuit. The feed-forward gain factor a2 of the third integrator is realized by the sampling capacitor Ca2_L and the integrating capacitor CI2_L, and the feed-forward gain factor a2 of the fourth integrator is realized by the sampling capacitor Ca2_R and the integrating capacitor CI2_R. By properly adjusting the feed-forward gain factors a2 of the second-stage integrating circuit, signal components of the output signal of the first-stage integrating circuit are restrained. When the output signal of the first-stage integrating circuit comprises highly-attenuated signal components, crosstalk between integrators of the first-stage integrating circuit only brings shaped quantized noises and significantly-reduced signal components.

Each of the foregoing solutions for eliminating crosstalk may be separately used or be combined with one another. For example, the solutions of adding the feed-forward gain factor a2 and increasing the gain and bandwidth of the op-amp may be simultaneously applied.

Figure 16:
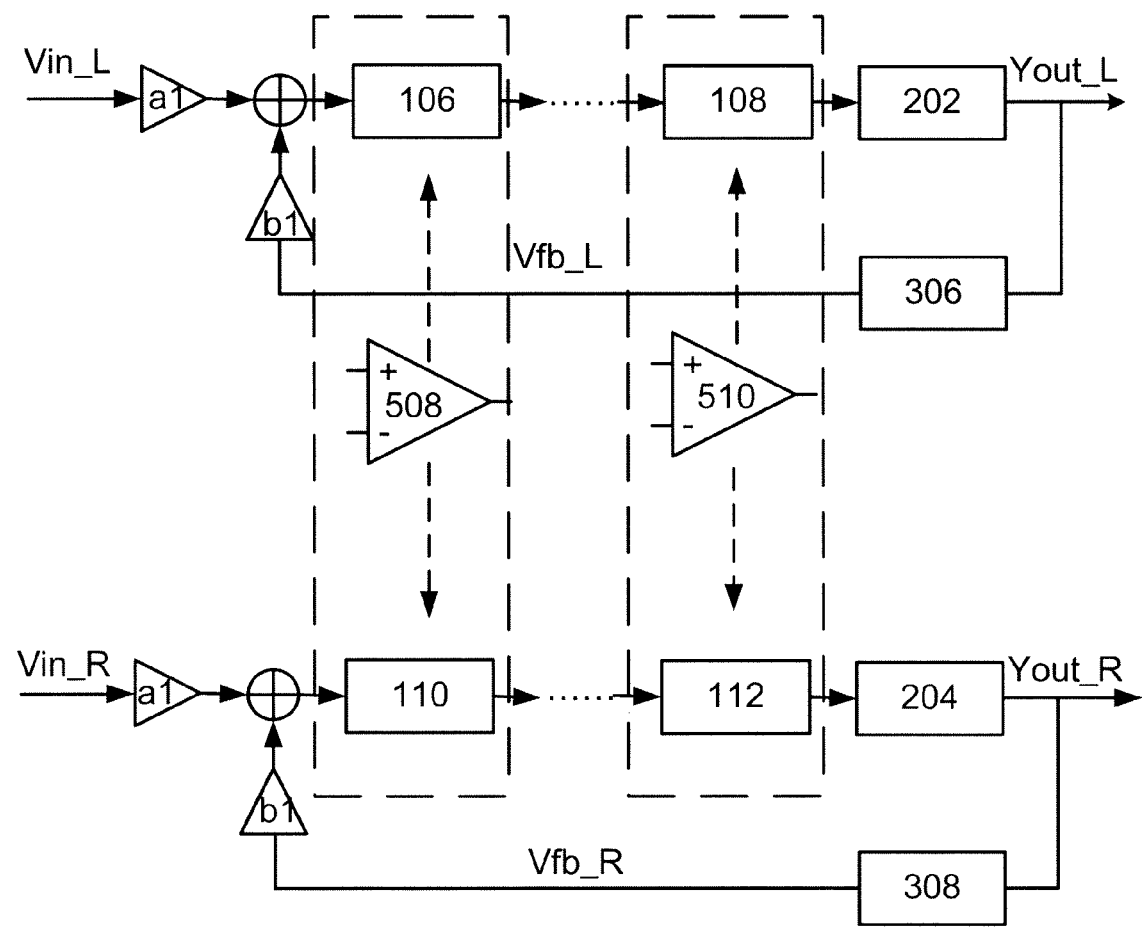
FIG. 16 is a schematic diagram of a two-path N-stage $\Sigma$-$\Delta$ modulator in accordance with a third embodiment of the present invention.

FIG. 16 shows a schematic diagram of a two-path N-stage Σ-Δ modulator in accordance with a third embodiment of the present invention. N is a positive integer larger than or equal to 1. In a first-stage integrating circuit, an integrator 106 and an integrator 110 sharing an op-amp 508 simultaneously process two input signals Vin_L and Vin_R inputted from two path input ends. In an N-th integrating circuit, an integrator 108 and an integrator 112 sharing an op-amp 510 simultaneously process the two input signals Vin_L and Vin_R, an output signal of a previous-stage integrating circuit, and received feedback signals. Since the principle of two-path N-stage Σ-Δ modulator in this embodiment is similar to that of the second embodiment and may be inferred from the first embodiment, it shall not be described for brevity.

Figure 17:
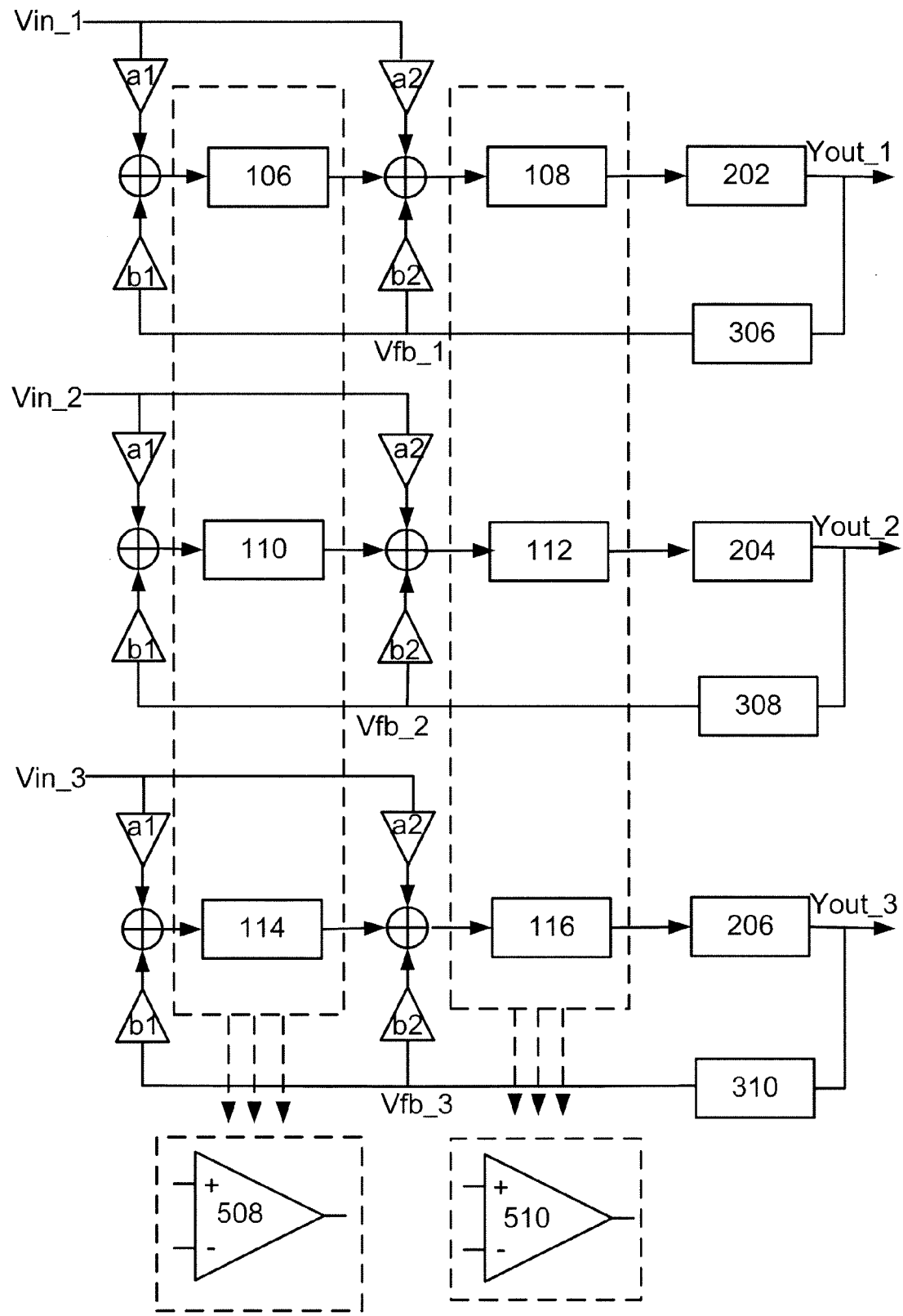
FIG. 17 is a schematic diagram of a three-path two-stage Σ-Δ modulator in accordance with a fourth embodiment of the present invention.

FIG. 17 shows a schematic diagram of a three-path two-stage Σ-Δ modulator in accordance with a fourth embodiment of the present invention. In a first-stage integrating circuit, integrators 106, 110 and 114 sharing an op-amp 508 simultaneously process input signals Vin_1, Vin_2 and Vin_3 from three path input ends. In a second-stage integrating circuit, integrators 108, 112, 116 sharing an op-amp 510 simultaneously process the input signals Vin_1, Vin_2 and Vin_3, output signals Vo1_1, Vo2_2 and Vo1_3 of the integrators 106, 110, 114.

Figure 18:
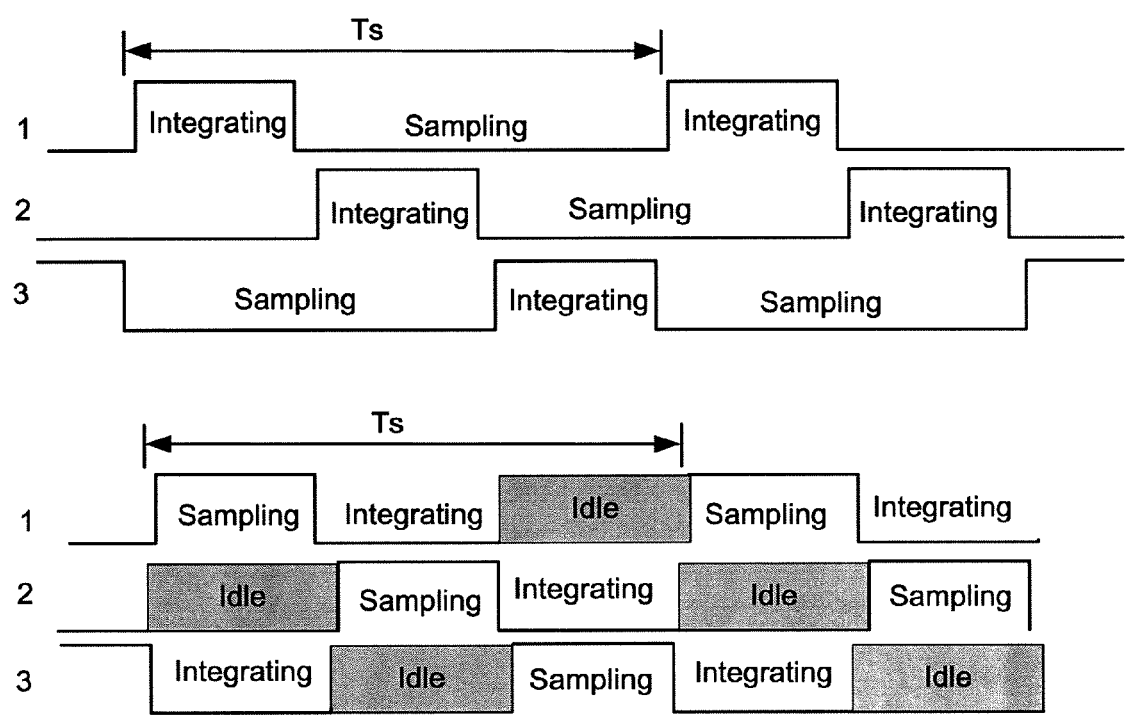
FIG. 18 is a timing diagram of integrators of a first-stage integrating circuit in the fourth embodiment and a timing diagram of integrators of a second-stage integrating circuit in the fourth embodiment of the present invention.

FIG. 18 shows a timing diagram of each of integrators of a first-stage integrating circuit in the fourth embodiment and a timing diagram of each of integrators of a second-stage integrating circuit in the fourth embodiment of the present invention. The principle of the embodiment is given with reference to FIG. 18.

During a first period of a clock cycle Ts, in the first-stage integrating circuit, the integrator 106 integrates the input signal Vin_1, and the integrators 110 and 114 respectively sample the input signals Vin_2 and Vin_3. At this point, in the second-stage integrating circuit, the integrator 116 performs integration, the integrator 108 samples the input signal Vin_1 and the output signal Vo1_1 of the integrator 106, and the integrator 112 is idle, i.e., the integrator 112 performs neither sampling nor integrating. During a second period of the clock cycle, in the first-stage integrating circuit, the integrator 110 integrates the input signal Vin_2, and the integrators 106 and 114 respectively sample the input signals Vin_1 and Vin_3. At this point, in the second-stage integrating circuit, the integrator 108 performs integration, the integrator 112 samples the input signal Vin_2 and the outputs signal Vo1_2 outputted by the integrator 110, and the integrator 116 is idle, i.e., the integrator 116 performs neither sampling nor integrating. During a third stage of the clock cycle, in the first-stage integrating circuit, the integrator 114 integrates the input signal Vin_3, the integrators 106 and 110 samples the input signals Vin_1 and Vin_2. At this point, in the second-stage integrating circuit, the integrator 112 performs integration, the integrator 116 samples the input signal Vin_3 and the output signal Vo1_3 outputted by the integrator 114, and the integrator 108 idle, i.e., the integrator 108 performs neither sampling nor integrating.

According to an embodiment of the present invention, an auxiliary method for a multi-path Σ-Δ modulator applied to a multi-path Σ-Δ modulator is provided. The multi-path Σ-Δ modulator comprises one shared op-amp, is inputted with one first input signal and one second input signal, and outputs one first output signal and one second output signal.

The auxiliary method comprises sampling the first input signal during a second period of a clock cycle to obtain a first sampled signal, and integrating the first sampled signal and a feedback of the first output signal during a first period of the clock cycle to obtain a first integrated signal; and sampling the second input signal during a first period of the clock cycle to obtain a second sampled signal, and integrating the second sampled signal and a feedback of the second input signal to obtain a second integrated signal; wherein, the feedback signal of the first output signal is obtained by quantizing and digital-to-analog converting the first integrated signal, and the feedback signal of the second output signal is obtained by quantizing and digital-to-analog converting the second integrated signal.

Preferably, in the auxiliary method of a multi-path Σ-Δ modulator, the multi-path Σ-Δ modulator may correspondingly output a third output signal and a fourth output signal, and the auxiliary method further comprises: respectively sampling the first input signal and the first integrated signal during the first period of the clock cycle to obtain a third sampled signal and a fourth sampled signal, and integrating the third sampled signal, the fourth sampled signal and a feedback signal of the third output signal during a next period of the clock cycle to obtain a third integrated signal; and respectively sampling the second input signal and the second integrated signal during the second period of the clock cycle to obtain a fifth sampled signal and a sixth sampled signal, and integrating the fifth sampled signal, the six sampled signal and a feedback signal of the fourth output signal during a next period of the clock cycle to obtain a fourth integrated signal; wherein, the feedback signal of the third output signal is generated by quantizing and digital-to-analog converting the third integrated signal, and the feedback signal of the fourth output signal is generated by quantizing and digital-to-analog converting the fourth integrated signal.

The foregoing clock cycle is determined by two non-overlapped clock signals generated by a clock signal generator, the two non-overlapped clock signals comprises delayed clock signals and original clock signals, and the shared op-amp has a high gain and a wider bandwidth compared to an op-amp of a multi-path Σ-Δ modulator that does not implement the op-amp sharing technique.

Likewise, in order to solve the problem of crosstalk caused by sharing the op-amp, when the multi-path Σ-Δ modulator according to the present invention comprises two stages or more than two stages of integrating circuits, feed-forward gain factors may be provided to integrating circuits subsequent to the second-stage integrating circuit. Further, T-type switches may also be applied to the multi-path Σ-Δ modulator according to the present invention so as to reduce charge injected at the instant that switches are opened.

In conclusion, according to a multi-path Σ-Δ modulator with a shared op-amp and an associated auxiliary method, an area of an SOC system is effectively reduced by sharing the op-amp, thus reducing production cost. Moreover, approaches of providing feed-forward gain factor a2, delay clock signals, T-type switches and increasing a gain and a bandwidth of the op-amp can be applied to effectively reduce crosstalk caused by sharing the op-amp.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A multi-path Σ-Δ modulator, comprising:
a first integrator, coupled to a first path input end;
a second integrator, coupled to a second path input end;
a shared operational amplifier (op-amp), being alternately coupled to the first integrator and the second integrator to generate an integrated signal;
two quantizers, respectively coupled to the first integrator and the second integrator, for comparing the integrated signal with a predetermined signal to output a digital signal;
two digital-to-analog converters (DAC), respectively coupled between output ends of the quantizers and the first integrator and the second integrator, for converting the digital signal outputted by the quantizers into an analog signal that is fed to either the first integrator or the second integrator; and
a clock signal generator, coupled to the first and second integrators and the quantizers, for providing clock signals for controlling the first and second integrators and the quantizers,
wherein the shared op-amp comprises a negative input end, a positive input end and an output end, and the first integrator comprises:
a first sampling component, coupled to the first path input end during a first period of a clock cycle and coupled to the negative input end of the shared op-amp during a second period of the clock cycle; and
a first integrating component, coupled between the negative input end and the output end of the shared op-amp during the second period of the clock cycle;
the second integrator comprises:
a second sampling component, coupled to the second path input end during the second period of the clock cycle and coupled to the negative input end of the shared op-amp during the first period of the clock cycle; and
a second integrating component, coupled between the negative input end of the output end of the shared op-amp during the first period of the clock cycle;
wherein, the clock cycle is determined by the clock signal generator.

2. The modulator as claimed in claim 1, further comprising:
a first switch, coupled between the negative input end of the shared op-amp and the first integrating component; and
a second switch, coupled between the first integrating component and the output end of the shared op-amp;
wherein, the first switch and the second switch are simultaneously closed, and the first switch is opened before the second switch is opened.

3. The modulator as claimed in claim 2, further comprising:
a third switch, coupled between the negative input end of the shared op-amp and the second integrating component; and
a fourth switch, coupled between the second integrating component and the output end of the shared op-amp;
wherein, the third switch and the fourth switch are simultaneously closed, and the third switch is opened before the fourth switch is opened.

4. The modulator as claimed in claim 2, wherein the first switch is a T-type switch.

5. The modulator as claimed in claim 1, wherein the clock signals generated by the clock signal generator comprise two non-overlapped clock signals.

6. A multi-path Σ-Δ modulator, comprising:
a first integrator, coupled to a first path input end;
a second integrator, coupled to a second path input end;
a first shared op-amp, being alternately coupled to the first integrator and the second integrator to generate a first integrated signal;
a third integrator, coupled to the first path input end and the first shared op-amp;
a fourth integrator, coupled to the second path input end and the first shared op-amp;
a second shared op-amp, being alternately coupled to the third integrator and the fourth integrator to generate a second integrated signal according to the first integrated signal,
two quantizers, respectively coupled to the third integrator and the fourth integrator, for comparing the second integrated signal with a predetermined signal to output a digital signal;
two DACs, respectively coupled between output ends of the two quantizers and the first integrator, the second integrator, the third integrator and the fourth integrator, for converting the digital signal outputted by the quantizers to an analog signal that is fed to either the first integrator and the third integrator or the second integrator and the fourth integrator; and
a clock signal generator, coupled to the first integrator, the second integrator, the third integrator, the fourth integrator and the quantizers, for providing clock signals for controlling the first integrator, the second integrator, the third integrator, the fourth integrator and the quantizers.

7. The modulator as claimed in claim 6, wherein the first shared op-amp comprises a negative input end, a positive input end and an output end, and the first integrator comprises:
a first sampling component, coupled to the first path input end during a non-second period of a clock cycle and coupled to the negative input end of the first shared op-amp during a second period of the clock cycle; and
a first integrating component, coupled between the negative input end and the output end of the first shared op-amp during the second period of the clock cycle;
the second integrator comprises:
a second sampling component, coupled to the second path input end during a non-first period of the clock cycle and coupled to the negative input end of the first shared op-amp during a first period of the clock cycle; and
a second integrating component, coupled between the negative input end and the output end of the first shared op-amp during the first period of the clock cycle;
wherein, the clock cycle is determined by the clock signal generator.

8. The modulator as claimed in claim 7, wherein the second shared op-amp comprises a negative input end, a positive input end and an output end, and the third integrator comprises:
a third integrating component, coupled between the negative input end and the output end of the second shared op-amp during the first period of the clock cycle;
a third sampling component, coupled to the negative input end of the second shared op-amp during the first period of the clock cycle, and coupled to the first path input end during a previous period of the first period of the clock cycle; and
a fourth sampling component, coupled to the first integrating circuit during the first period of the clock cycle, and coupled to the negative input end of the second shared op-amp during the previous period of the first period of the clock cycle;
the fourth integrator comprises:
a fourth integrating component, coupled between the negative input end and the output end of the second shared op-amp during the second period of the clock cycle;
a fifth sampling component, coupled to the negative input end of the second shared op-amp during the second period of the clock cycle, and coupled to the second path input end during a previous period of the second period of the clock cycle; and
a sixth sampling component, coupled to the first integrating circuit during the second period of the clock cycle, and coupled to the negative input end of the second shared op-amp during the previous period of the second period of the clock cycle.

9. The modulator as claimed in claim 8, further comprising:
a first plurality of switches, coupled between negative input ends of the first and second shared op-amps and the integrating components; and
a second plurality of switches, coupled between the integrating components and output ends of the first and second shared op-amps;
wherein, the first plurality of switches and the second plurality of switches are simultaneously closed, and the first plurality of switches are opened before the second plurality of switches are opened.

10. The modulator as claimed in claim 9, wherein the first plurality of switches are T-type switches.

11. The modulator as claimed in claim 8, further comprising:
a third plurality of switches, coupled between the negative input ends of the first and second op-amps and the sampling components; and
a fourth plurality of switches, coupled between the output ends of the first and second op-amps and the sampling components of the third integrator and the fourth integrator;
wherein, the third plurality of switches are opened before the fourth plurality of switches are opened.

12. The modulator as claimed in claim 6, wherein the clock signals generated by the clock signal generator comprise two non-overlapped clock signals.

13. The modulator as claimed in claim 6, further comprising a feed-forward gain unit, coupled between the first integrator and the third integrator and between the third integrator and the fourth integrator, for increasing a feed-forward gain factor to restrain signal components of the first integrated signal outputted by the first shared op-amp, so as to reduce crosstalk between multiple paths.

14. A multi-path Σ-Δ modulating method for a multi-path Σ-Δ modulator with a shared op-amp, the multi-path Σ-Δ modulator being inputted with a first input signal and a second input signal and correspondingly outputting a first output signal and a second output signal, the method comprising:
sampling the first input signal during a second period of a clock cycle to obtain a first sampled signal, and integrating the first sampled signal, and a feedback signal of the first output signal during a first period of the clock cycle to obtain a first integrated signal; and
sampling the second input signal during a first period of the clock cycle to obtain a second integrated signal, and integrating the second sampled signal and a feedback signal of the second output signal during a second period of the clock cycle to obtain a second integrated signal, the multi-path Σ-Δ modulator outputting a third output signal and a fourth output signal, and the method further comprising:

respectively sampling the first input signal and the first integrated signal during the first period of the clock cycle to obtain a third sampled signal and a fourth sampled signal, and integrating the third sampled signal, the fourth sampled signal and a feedback signal of the third output signal during a next period of the first period of the clock cycle to obtain a third integrated signal; and respectively sampling the second input signal and the second integrated signal during the second period of the clock cycle to obtain a fifth sampled signal and a sixth sampled signal, and integrating the fifth sampled signal, the sixth sampled signal and a feedback signal of the fourth output signal during a next period of the second period of the clock cycle to obtain a fourth integrated signal.

15. The method as claimed in claim 14, wherein the feedback signal of the first output signal is generated by quantizing and digital-to-analog converting the first integrated signal, and the feedback signal of the second output signal is generated by quantizing and digital-to-analog converting the second integrated signal.

16. The method as claimed in claim 14, wherein the feedback signal of the third output signal is generated by quantizing and digital-to-analog converting the third integrated signal, and the feedback signal of the fourth output signal is generated by quantizing and digital-to-analog converting the fourth integrated signal.

17. The method as claimed in claim 14, wherein the clock cycle is determined by two non-overlapped clock signals generated by a clock signal generator.

18. The method as claimed in claim 17, wherein the two non-overlapped clock signals comprise a delayed clock signal and an original clock signal.

* * * * *